United States Patent
Chuang et al.

(10) Patent No.: US 9,525,265 B2
(45) Date of Patent: Dec. 20, 2016

(54) LASER REPETITION RATE MULTIPLIER AND FLAT-TOP BEAM PROFILE GENERATORS USING MIRRORS AND/OR PRISMS

(71) Applicant: KLA-Tencor Corporation, Milpitas, CA (US)

(72) Inventors: Yung-Ho Alex Chuang, Cupertino, CA (US); Xiaoxu Lu, San Jose, CA (US); Justin Dianhuan Liou, Santa Clara, CA (US); J. Joseph Armstrong, Fremont, CA (US); Yujun Deng, San Jose, CA (US); John Fielden, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/596,738

(22) Filed: Jan. 14, 2015

(65) Prior Publication Data

US 2015/0372446 A1     Dec. 24, 2015

Related U.S. Application Data

(60) Provisional application No. 62/015,016, filed on Jun. 20, 2014, provisional application No. 62/038,471, filed on Aug. 18, 2014.

(51) Int. Cl.
*H01S 3/10* (2006.01)
*H01S 3/00* (2006.01)

(52) U.S. Cl.
CPC ........... *H01S 3/10046* (2013.01); *H01S 3/005* (2013.01); *H01S 3/10061* (2013.01);
(Continued)

(58) Field of Classification Search
CPC .............. H01S 3/10046; H01S 3/10061; H01S 2301/20; H01S 3/10; H01S 2301/206
See application file for complete search history.

(56) References Cited

U.S. PATENT DOCUMENTS

| 4,710,030 A | 12/1987 | Tauc et al. |
| 4,718,766 A | 1/1988 | Greenstein |
| (Continued) | | |

FOREIGN PATENT DOCUMENTS

| JP | 2006-186046 A | 7/2006 |
| JP | 200974802 A | 4/2009 |
| (Continued) | | |

OTHER PUBLICATIONS

Herriott et al.: "Off-Axis Paths in Spherical Mirror Interferometers", Applied Optics 3, #4, pp. 523-526 (1964).
(Continued)

*Primary Examiner* — Yuanda Zhang
(74) *Attorney, Agent, or Firm* — Bever, Hoffman & Harms, LLP

(57) ABSTRACT

A repetition rate (pulse) multiplier includes one or more beam splitters and prisms forming one or more ring cavities with different optical path lengths that delay parts of the energy of each pulse. A series of input laser pulses circulate in the ring cavities and part of the energy of each pulse leaves the system after traversing the shorter cavity path, while another part of the energy leaves the system after traversing the longer cavity path, and/or a combination of both cavity paths. By proper choice of the ring cavity optical path length, the repetition rate of an output series of laser pulses can be made to be a multiple of the input repetition rate. The relative energies of the output pulses can be controlled by choosing the transmission and reflection coefficients of the beam splitters. Some embodiments generate a (Continued)

time-averaged output beam profile that is substantially flat in one dimension.

9 Claims, 28 Drawing Sheets

(52) U.S. Cl.
CPC ............... *H01S 3/0071* (2013.01); *H01S 3/10* (2013.01); *H01S 2301/20* (2013.01); *H01S 2301/203* (2013.01); *H01S 2301/206* (2013.01)

(56) References Cited

U.S. PATENT DOCUMENTS

| | | | |
|---|---|---|---|
| 4,999,014 A | 3/1991 | Gold et al. | |
| 5,119,382 A | 6/1992 | Kennedy et al. | |
| 5,172,382 A | 12/1992 | Loh et al. | |
| 5,189,481 A | 2/1993 | Jann et al. | |
| 5,276,548 A | 1/1994 | Margalith | |
| 5,563,702 A | 10/1996 | Emery et al. | |
| 5,999,310 A | 12/1999 | Shafer et al. | |
| 6,201,601 B1 | 3/2001 | Vaez-Iravani et al. | |
| 6,233,052 B1 | 5/2001 | Zare et al. | |
| 6,271,916 B1 | 8/2001 | Marxer et al. | |
| 6,275,514 B1* | 8/2001 | Katzir | G03F 7/2053 372/25 |
| 6,549,267 B1 | 4/2003 | Kudo | |
| 6,577,782 B1 | 6/2003 | Leaird et al. | |
| 6,608,676 B1 | 8/2003 | Zhao et al. | |
| 6,693,930 B1 | 2/2004 | Chuang et al. | |
| 6,734,968 B1 | 5/2004 | Wang et al. | |
| 6,770,866 B2 | 8/2004 | Retschke et al. | |
| 6,816,520 B1 | 11/2004 | Tulloch et al. | |
| 7,151,632 B2 | 12/2006 | Biss et al. | |
| 7,187,500 B2 | 3/2007 | Chuang et al. | |
| 7,345,825 B2 | 3/2008 | Chuang et al. | |
| 7,352,457 B2 | 4/2008 | Kvamme et al. | |
| 7,449,673 B2 | 11/2008 | Chuang et al. | |
| 7,453,486 B2 | 11/2008 | Katzir et al. | |
| 7,483,146 B1 | 1/2009 | Zorabedian | |
| 7,525,649 B1 | 4/2009 | Leong et al. | |
| 7,528,342 B2 | 5/2009 | Deshi | |
| 7,528,943 B2 | 5/2009 | Brown et al. | |
| 7,667,841 B2 | 2/2010 | Opsal | |
| 7,738,515 B2 | 6/2010 | Spinelli et al. | |
| 7,957,066 B2 | 6/2011 | Armstrong et al. | |
| 8,374,206 B2 | 2/2013 | Peng et al. | |
| 8,618,254 B2 | 12/2013 | Giaccia et al. | |
| 8,873,596 B2 | 10/2014 | Dribinski et al. | |
| 8,929,406 B2 | 1/2015 | Chuang et al. | |
| 2003/0043876 A1 | 3/2003 | Lublin et al. | |
| 2003/0227618 A1 | 12/2003 | Some | |
| 2004/0095573 A1 | 5/2004 | Tsai et al. | |
| 2005/0110988 A1 | 5/2005 | Nishiyama et al. | |
| 2005/0190452 A1 | 9/2005 | Govorkov et al. | |
| 2006/0126681 A1 | 6/2006 | Botma et al. | |
| 2006/0126682 A1 | 6/2006 | Rodin et al. | |
| 2006/0171036 A1 | 8/2006 | Govorkov et al. | |
| 2007/0002465 A1 | 1/2007 | Chuang et al. | |
| 2007/0047600 A1 | 3/2007 | Luo et al. | |
| 2007/0090278 A1 | 4/2007 | Botma | |
| 2007/0121107 A1 | 5/2007 | Tsai et al. | |
| 2007/0295974 A1* | 12/2007 | Fontanella | B23K 26/0604 257/88 |
| 2008/0126682 A1 | 5/2008 | Rodin et al. | |
| 2009/0052480 A1* | 2/2009 | Cobb | G03F 7/70025 372/25 |
| 2009/0080085 A1 | 3/2009 | Botma | |
| 2009/0180176 A1 | 7/2009 | Armstrong et al. | |
| 2010/0108913 A1 | 5/2010 | Ershov et al. | |
| 2010/0163757 A1 | 7/2010 | Joobeur et al. | |
| 2011/0080580 A1 | 4/2011 | Fermann et al. | |
| 2011/0228263 A1 | 9/2011 | Chuang et al. | |
| 2011/0279819 A1 | 11/2011 | Chuang et al. | |
| 2012/0026578 A1 | 2/2012 | Sakuma | |
| 2012/0275478 A1 | 11/2012 | Krausz et al. | |
| 2012/0314286 A1 | 12/2012 | Chuang et al. | |
| 2013/0077086 A1 | 3/2013 | Chuang et al. | |
| 2013/0313440 A1 | 11/2013 | Chuang et al. | |
| 2014/0016655 A1 | 1/2014 | Armstrong | |
| 2014/0050234 A1 | 2/2014 | Ter-Mikirtychev | |
| 2014/0153596 A1 | 6/2014 | Chuang et al. | |
| 2014/0204965 A1 | 7/2014 | Kimberlin et al. | |
| 2015/0041666 A1 | 2/2015 | Chuang et al. | |

FOREIGN PATENT DOCUMENTS

| | | |
|---|---|---|
| JP | 4694768 B | 6/2011 |
| JP | 2012-098103 A | 5/2012 |
| KR | 10-2000-0034461 A | 6/2000 |
| KR | 1020100025297 A | 3/2010 |
| WO | 00/14834 A1 | 3/2000 |
| WO | WO00/14834 A1 | 3/2000 |
| WO | WO2010/037106 A2 | 4/2010 |
| WO | 2011/064059 A1 | 6/2011 |
| WO | WO2011/156283 A2 | 12/2011 |
| WO | WO2012/167310 A1 | 12/2012 |
| WO | WO2012/173943 A2 | 12/2012 |
| WO | WO2014/089020 A1 | 6/2014 |
| WO | WO2014/116922 A1 | 7/2014 |

OTHER PUBLICATIONS

Herriott et al.: "Folded Optical Delay Lines", Applied Optics 4, #8, pp. 883-889 (1965).

White, John U.: "Long Optical Paths of Large Aperture", Journal of the Optical Society of America 32, #5, pp. 285-288 (1942).

International Search Report and Written Opinion dated Mar. 19, 2014 for PCT/US2013/072774 filed Dec. 3, 2013 in the name of KLA-Tencor Corporation (14 pages).

* cited by examiner

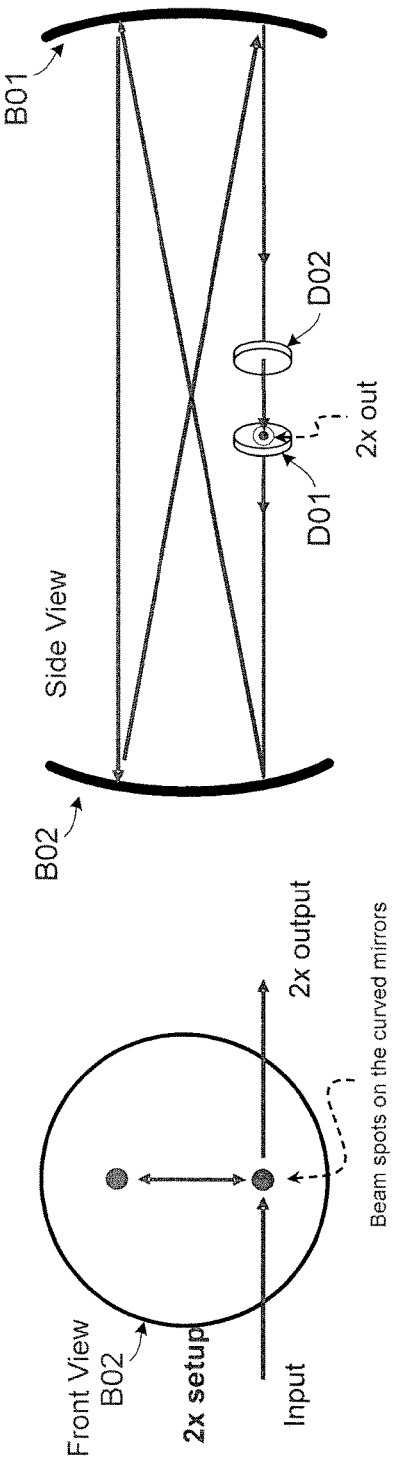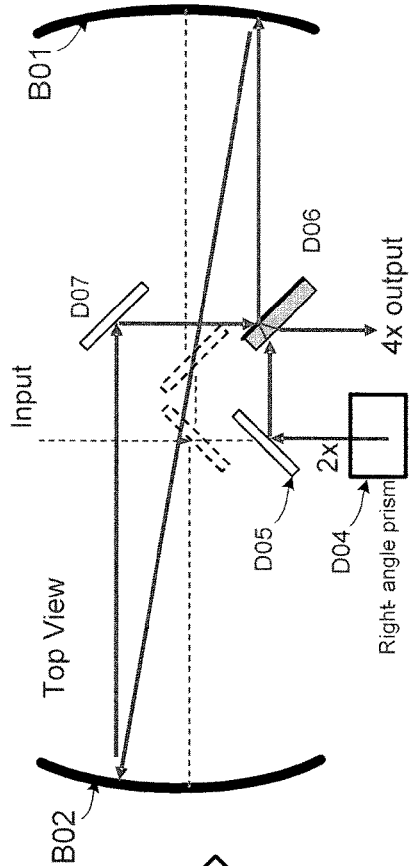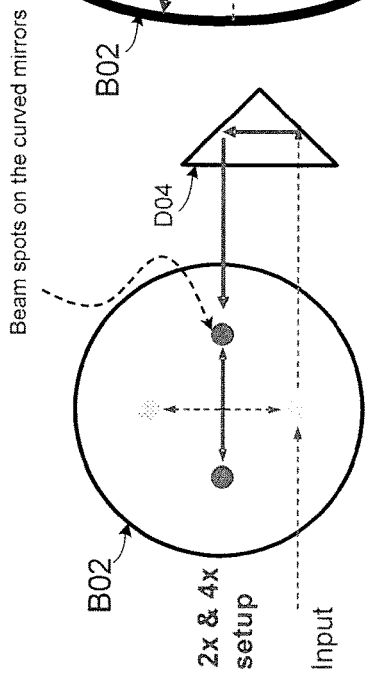
Figure 16A
Figure 16B
Figure 16C
Figure 16D

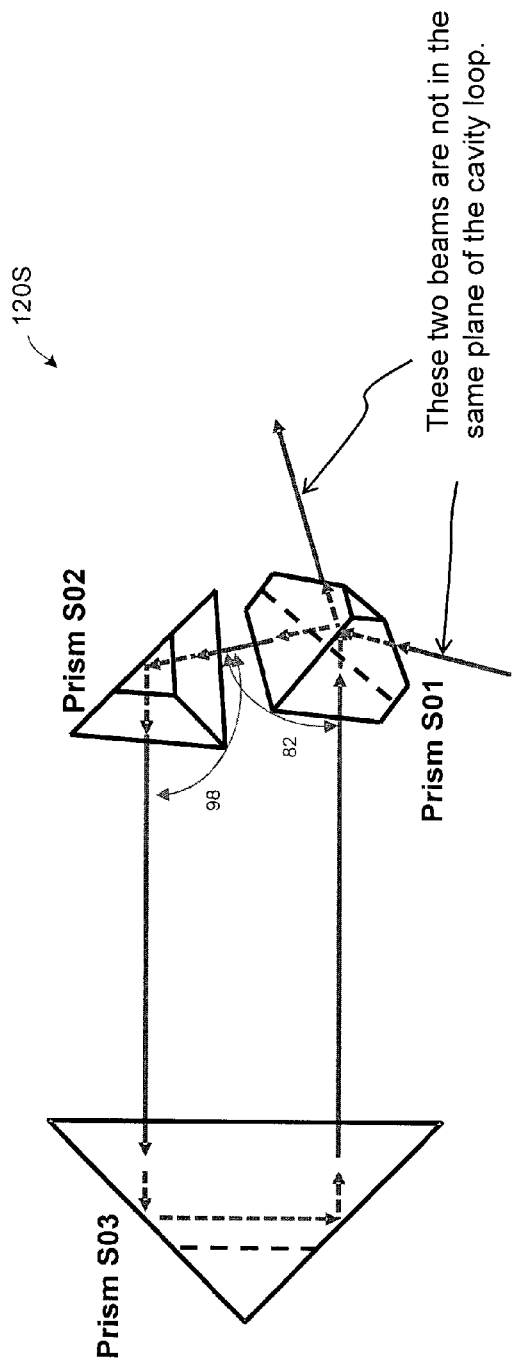
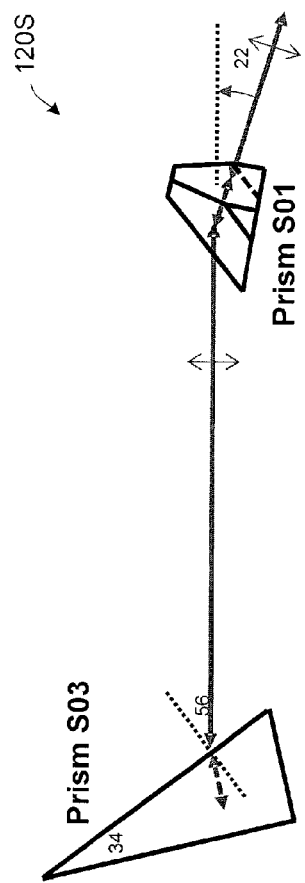
Figure 27A
Figure 27B

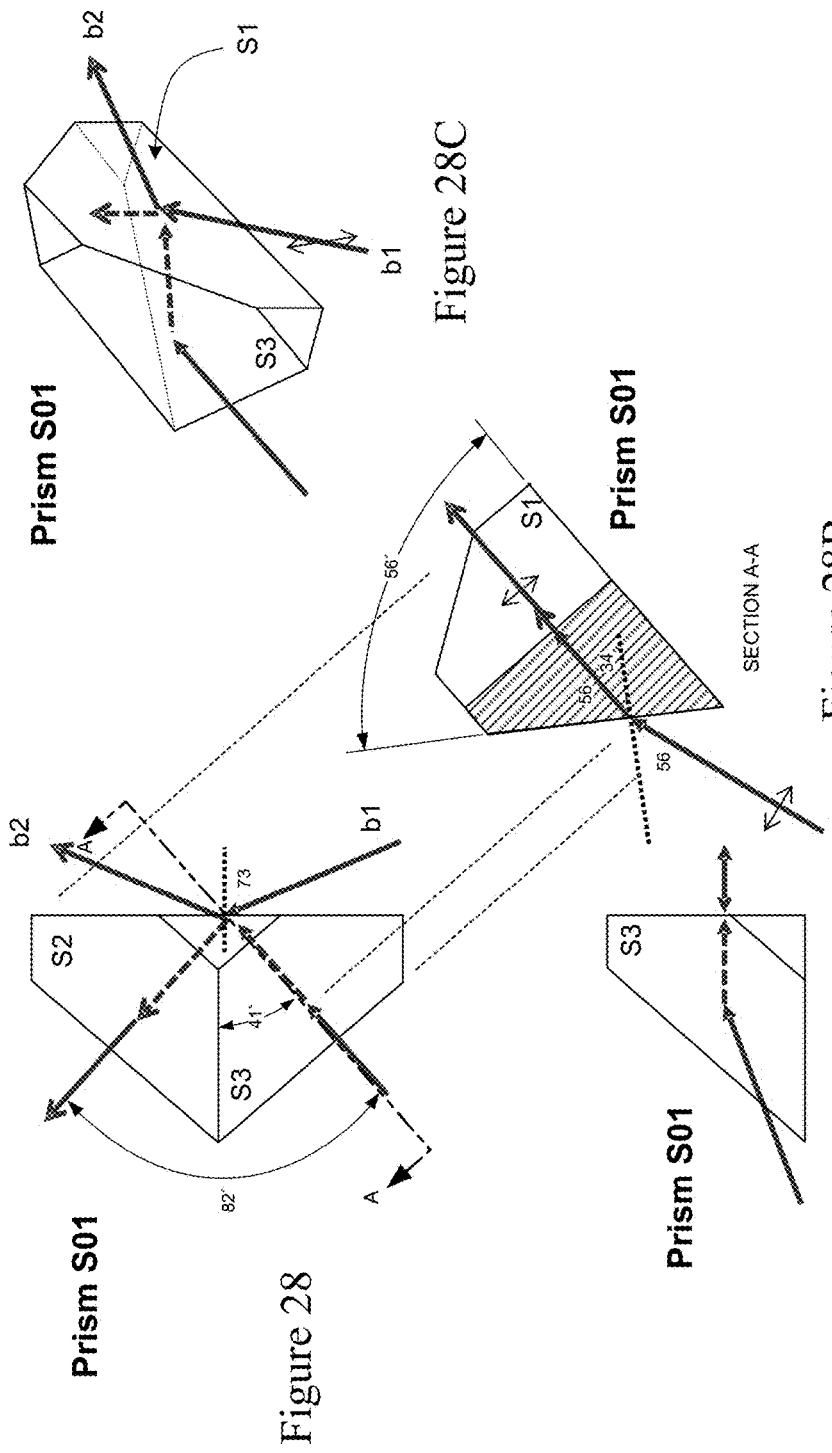

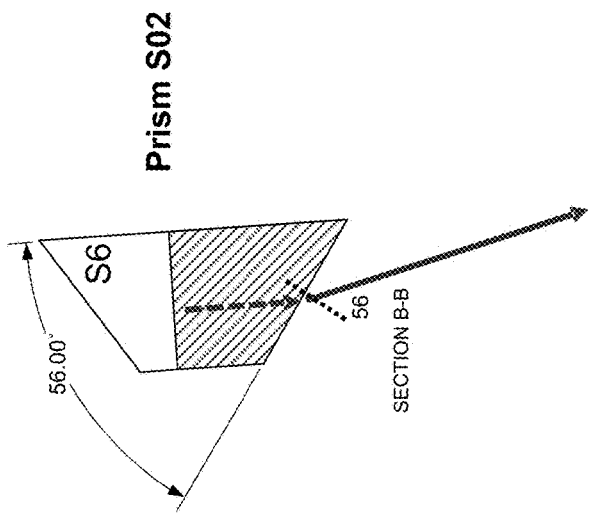
Figure 30B
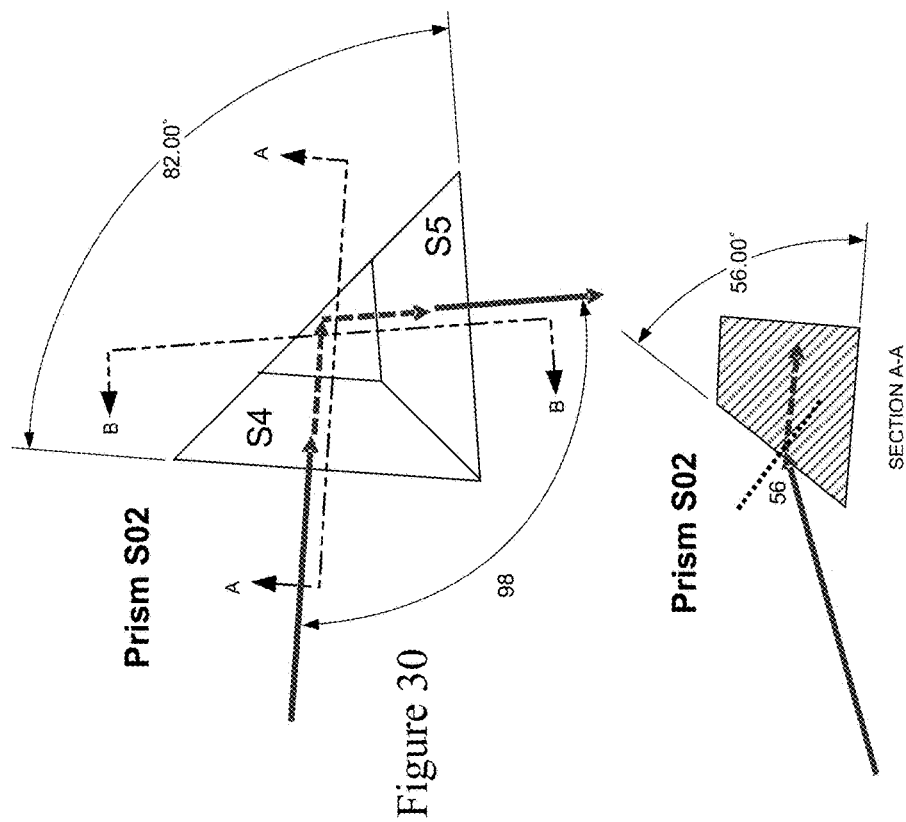
Figure 30
Figure 30A

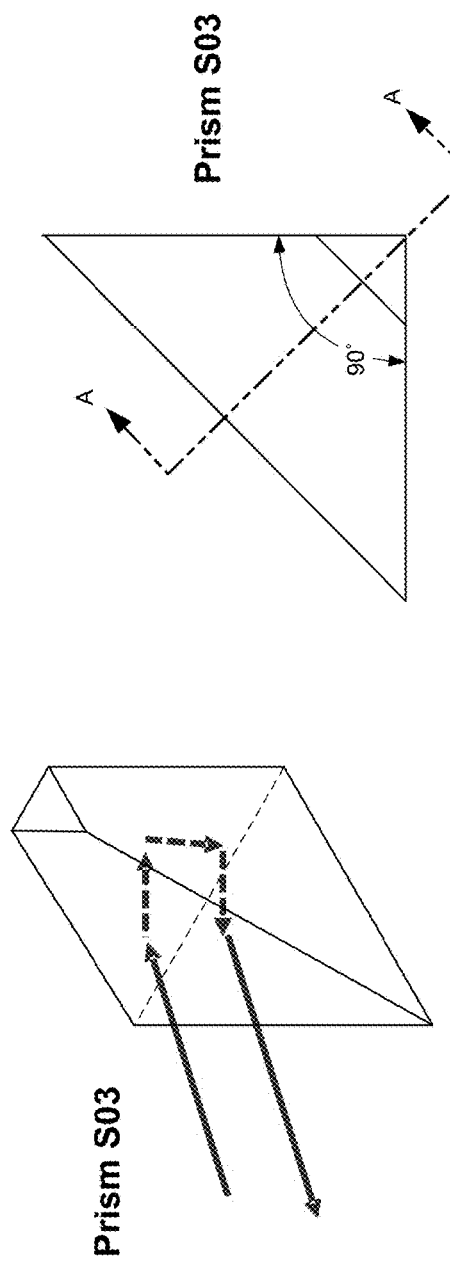
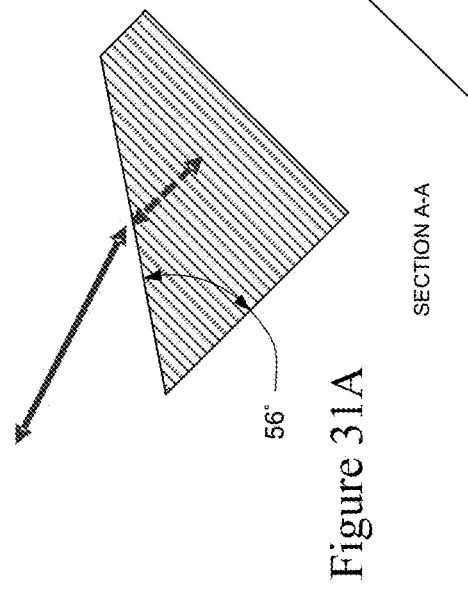
Figure 31
Figure 31A
Figure 31B
Figure 31C

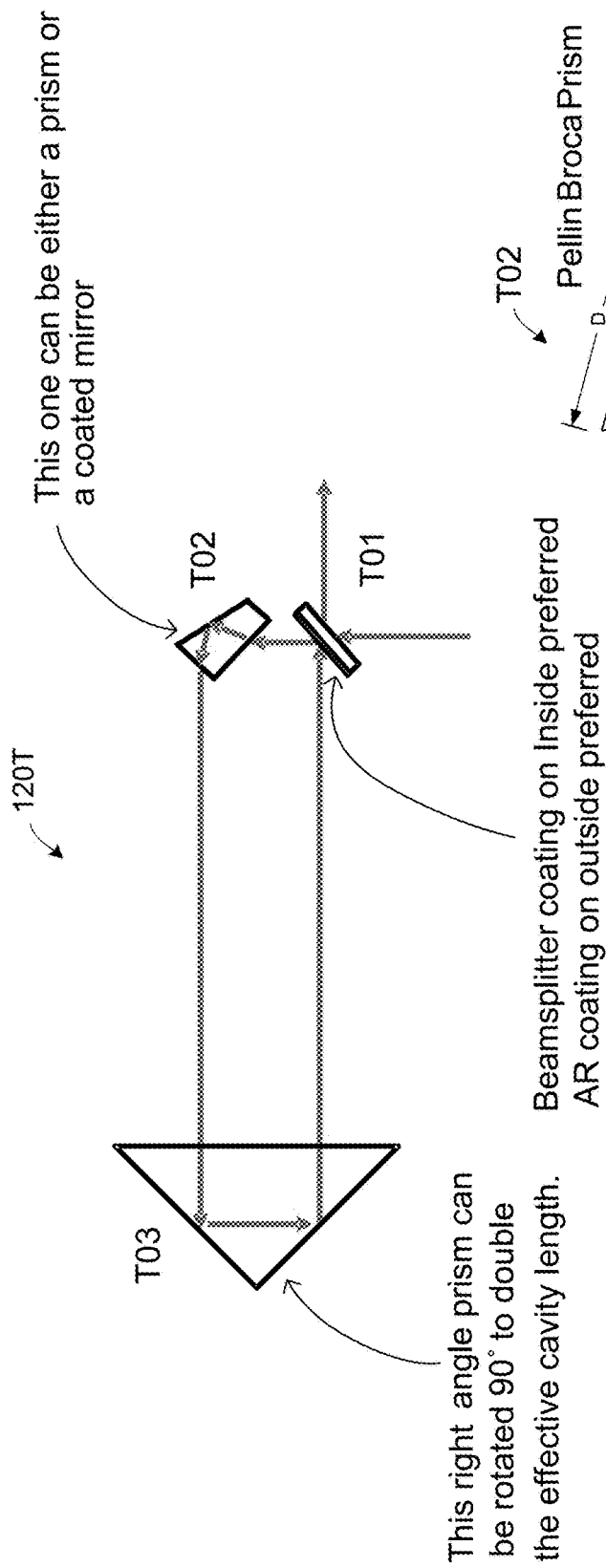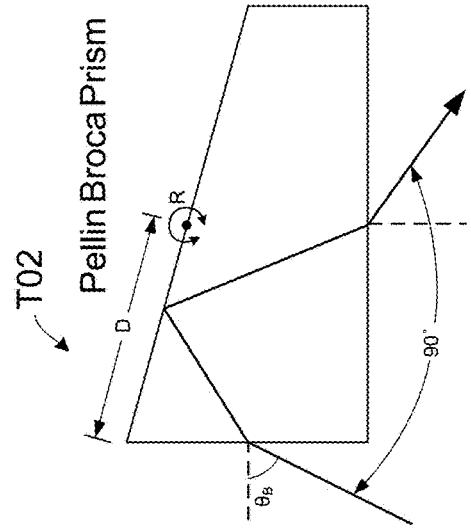
Figure 32A
Figure 32B

LASER REPETITION RATE MULTIPLIER AND FLAT-TOP BEAM PROFILE GENERATORS USING MIRRORS AND/OR PRISMS

RELATED APPLICATIONS

The present application claims priority to U.S. Provisional Patent Application Ser. No. 62/015,016, entitled "Laser Pulse Multiplication Using Prisms", filed on Jun. 20, 2014, and incorporated by reference herein.

The present application also claims priority to U.S. Provisional Patent Application Ser. No. 62/038,471 entitled "Laser Repetition Rate Multiplier and Flat-Top Beam Profile Generators", filed on Aug. 18, 2014, and incorporated by reference herein.

This application is related to U.S. patent application Ser. No. 13/487,075 entitled "Semiconductor Inspection And Metrology System Using Laser Pulse Multiplier" and filed on Jun. 1, 2012 by Chuang et al., to U.S. patent application Ser. No. 13/711,593 entitled "Semiconductor Inspection and Metrology System Using Laser Pulse Multiplier" and filed on Dec. 11, 2012 by Chuang et al., to U.S. patent application Ser. No. 14/455,161, entitled "Split Gaussian Beams and Multi-Spot Flat-Top Illumination for Surface Scanning Systems" and filed on Aug. 8, 2014 by Chuang et al. All of these applications are incorporated herein by reference.

BACKGROUND OF THE INVENTION

Field of the Invention

The present invention relates to reducing the optical peak power of laser pulses in the temporal domain and, optionally, to homogenizing the beam power distribution in a spatial domain. This peak power reduction and homogenization system may use curved mirrors, beam splitters, wave plates, and prisms to generate an optimized pulse repetition-rate multiplier with a flat-top spatial power distribution profile. The present invention is particularly useful in semiconductor inspection and metrology systems.

Related Art

The illumination needs for inspection and metrology are generally best met by continuous wave (CW) light sources. A CW light source has a constant power level, which allows for images or data to be acquired continuously. However, at many wavelengths of interest, particularly ultraviolet (UV) wavelengths, CW light sources of sufficient radiance (power per unit area per unit solid angle) are not available, are expensive or are unreliable. If a pulse laser is the only available, or cost-effective, light source with sufficient time-averaged radiance at the wavelength of interest, then using a laser with a high repetition rate and wide pulse width is best. The higher the pulse repetition rate, the lower the instantaneous peak power per pulse for the same time-averaged power level. The lower peak power of the laser pulses results in less damage to the optics and to the sample or wafer being measured, as most damage mechanisms are non-linear and depend more strongly on peak power rather than on average power.

In inspection and metrology applications, an additional advantage of an increased repetition rate is that more pulses are collected per data acquisition or per pixel leading to better averaging of the pulse-to-pulse variations and improved signal-to-noise ratios. Furthermore, for a rapidly moving sample, a higher pulse rate may lead to a better sampling of the sample position as a function of time, as the distance moved between each pulse is smaller.

The repetition rate of a laser subsystem can be increased by improving the laser medium, the pump system, and/or its driving electronics. Unfortunately, modifying a UV laser that is already operating at a predetermined repetition rate can require a significant investment of time and money to improve one or more of its constituent elements, and may only improve the repetition rate by a small increment. Furthermore increasing the repetition rate of the fundamental laser in a UV laser reduces the peak power of the fundamental. This reduces the efficiency of the frequency conversion (which is necessarily a non-linear process) and so makes it harder to generate high average UV power levels.

In many inspection applications, a flat or uniform, rather than Gaussian, illumination profile is desired. Spatially uniform illumination on the sample results in a more uniform signal-to-noise ratio across the illuminated area and a higher dynamic range compared with non-uniform illumination. Although incoherent light sources may be able to more readily generate uniform illumination than the Gaussian profile of a laser, such light sources have much broader bandwidth (complicating the optical design because of chromatic aberration) and lower power density (reducing signal-to-noise ratios) than a laser can provide. One known way to achieve an approximately flat profile from a Gaussian laser beam is to crop off the Gaussian tails and only use the central region (close to peak) of the beam. This method is simple to apply; however, if a reasonably flat profile is required a large fraction of the laser power is cropped off and wasted. For example, if the maximum intensity variation in the illumination is required to be about 10%, then about 65% of the power is wasted, and a 20% variation requires wasting approximately 50% of the power.

Therefore, a need arises for a practical, inexpensive technique to improve the repetition rate of a UV laser that operates on the output of the laser. Furthermore it would be advantageous if the optical subsystem that increases the repetition rate can be compact so that it can readily be incorporated into a system without taking up a lot of space. Still furthermore there is a need for a repetition rate multiplier that can generate an approximately flat output profile while adding no, or few, additional components to the repetition rate multiplier, thus saving space and minimizing optical power losses.

SUMMARY OF THE INVENTION

A system for inspecting or measuring a sample is described. This system includes an illumination source, a device configured to perform light detection, optics configured to direct light from the illumination source to the sample and to direct light outputs, reflections, or transmissions from the sample to a sensor. Notably, the illuminator comprises a pulsed laser emitting an ultra-violet (UV) wavelength (i.e. a wavelength shorter than about 400 nm) and a repetition rate multiplier that multiplies the repetition rate of the pulses from the pulsed laser. The repetition rate multiplier increases the number of laser pulses per unit time and decreases the peak power of each laser pulse. The decreased peak power reduces or eliminates damage to the system optics or the sample being inspected or measured, and allows use of a higher average laser power level for a given damage threshold, thus improving the signal-to-noise ratio and/or the speed of the inspection or measurement. Multiplying the repetition rate after generation of the UV harmonics maintains the efficiency of the UV harmonic conversion because the peak power of the laser pulses is not reduced in the harmonic conversion chain.

Inspection and measurement systems incorporating a repetition rate multiplier as described herein are particularly useful at deep UV (DUV) wavelengths, i.e. wavelengths shorter than about 300 nm, and vacuum UV (VUV) wavelengths, i.e. wavelengths shorter than about 190 nm, as high peak power levels at these wavelengths can quickly damage many different kinds of materials.

The sample may be supported by a stage, which moves the sample relative to the optics during the inspection or measurement.

The exemplary inspection or measurement system may include one or more illumination paths that illuminate the sample from different angles of incidence and/or different azimuth angles and/or with different wavelengths and/or polarization states. The exemplary inspection or measurement system may include one or more collection paths that collect light reflected or scattered by the sample in different directions and/or are sensitive to different wavelengths and/or to different polarization states.

Inspection and measurement systems incorporating a repetition rate multiplier may be further configured to generate a time-averaged spatially uniform beam profile (i.e. a flat-top profile). An inspection or measurement system incorporating a multiplier and flat-top profile generators described herein provide two or more times multiplication of the laser repetition rate and a more uniform time-averaged beam profile using a small number of optical components in a compact space. The inspection and metrology systems described herein are capable of using higher average laser power enabling a higher throughput, better signal quality, and more efficient use of the laser energy.

Method and systems for multiplying the repetition rate of a pulsed laser are described. These methods and systems split an input laser pulse into multiple pulses separated in time so as to multiply the laser repetition rate by an integer such as 2, 3 or 4. An incoming pulse is split into two so that part of the pulse continues on, and part of the pulse enters a ring cavity. After traversing at least a section of the ring cavity, the pulse is split again and part of the pulse leaves the ring cavity and part continues on in the ring cavity. The repetition rate multiplier may be further configured to generate a time-averaged output profile that is approximately flat in one dimension and substantially Gaussian in the perpendicular dimension. The repetition rate multiplier may comprise flat mirrors, curved mirrors, polarized beam splitters, wave-plates, beam compensators and/or lenses.

In one exemplary embodiment, an input laser pulse is split into two by a wave plate and a polarized beam splitter. One part of the input laser pulse is directed around a short ring cavity loop and the other part is directed around a long ring cavity loop. On their way back to the input/output coupler (which may comprise a polarized beam splitter), the pulses encounter another wave plate which determines the fraction of the pulse energy that leaves the cavities. The remaining fraction of the pulse energy traverses again the cavities.

In one exemplary embodiment the short and long cavity loop lengths are respectively set to be $1/3$ and $2/3$ of the input laser pulse-to-pulse spatial separation so that the output pulses will be delayed in time by $1/3$, $2/3$ or an integer multiple of $1/3$ of the pulse-to-pulse period. These delayed pluses form a pulse train with a repetition rate that is three times that of the original input laser pulses. The orientation and retardance of the two wave plates may be chosen such that the output pulses have substantially equal pulse-to-pulse energy.

In another exemplary embodiment, which can also triple the repetition rate, two mirrors form a ring cavity and two beam splitters are placed in between. Whenever a pulse goes through a beam splitter, it splits into two pulses; one of the pulses goes straight through while the other is deflected. With these two beam splitters, some pulses traverse a longer cavity loop while others traverse a shorter one. In one exemplary embodiment, the shorter loop has a path length approximately equal to about $1/3$ of the original input pulse-to-pulse separation, and the longer loop path length is approximately $2/3$ of the pulse-to-pulse separation. In this embodiment, the output pulses form a pulse train with a repetition rate that is three times that of the original input pulses. With an appropriate choice of mirror curvature, mirror separation, and beam-splitter reflectivities, the output pulses can have substantially equal pulse-to-pulse energy.

In one embodiment, two beam compensators comprising flat plates are place in the cavity to substantially compensate for the shifts in the beam path caused by the beam splitters so that the beams reflect from the mirrors in a pattern that is substantially symmetric about the cavity axis. In another embodiment, one (or both) beam compensators are replaced by a prism (or prisms) that substantially compensates for the shift in beam path of one (or both) beam splitters. In yet another embodiment, no prism or beam compensator is used and the beam splitters are positioned in such a way that each compensates for the beam shift caused by the other.

In yet another exemplary embodiment, flat mirrors and prisms are inserted into the light path within the cavity to form a secondary cavity loop between the same pair of curved mirrors with a loop length about half that of the primary cavity loop. If the primary cavity loop length is set to about half of the original input pulse-to-pulse separation, the primary cavity loop can double the pulse repetition rate. Pulses leaving the primary cavity loop enter the secondary cavity loop which has a length that is about half that of the primary cavity loop, thus doubling the pulse repetition rate again, resulting in an output pulse repetition rate that is four times that of the input laser.

Some embodiments use a prism such as an isosceles triangle prism or a Dove prism to double the number of round trips that the beam makes within the cavity. The two cavity routes generate two parallel output beams. The deviation between these two beams can be chosen such that they overlap to form a time-averaged spatially approximately flat-top beam profile.

In one embodiment, a 2× pulse multiplier scheme is used as a base for flat-top profile generation. In another embodiment, a 3× pulse multiplier is used as a base for flat-top profile generation. In yet another embodiment, the above-mentioned 4× pulse multiplier scheme is used as a base for flat-top profile generation. This embodiment can generate four parallel beams with a predetermined power ratio between them. By selecting the separations between the beams and the power ratios between them, a wider flatter time-averaged beam profile can be achieved. Any of these repetition-rate multipliers that generate an approximately flat-top profile may comprise beam compensators and/or prisms.

In one embodiment, the ring cavity comprises right angle mirror pairs. In another embodiment, the ring cavity comprises prisms that utilize total internal reflection to achieve high reflectivity. With an appropriate prism design, a ring cavity using prisms can achieve low losses without using high reflectivity coatings. High reflectivity coatings can easily be damaged by high intensity laser pulses, particularly at short wavelengths, so many of the methods and systems described herein can have a longer operating life and/or lower maintenance costs compared with other ring cavities especially when used for multiplying the repetition rate of DUV and VUV lasers.

In one embodiment one or more prisms in the ring cavity are designed so that the angle of incidence of the laser beam entering and exiting the prism is close to Brewster's angle and the laser beam is substantially P-polarized relative to the prism entrance and exit surfaces, so that the losses due to reflection are kept small without using any anti-reflection (AR) coating. AR coatings can easily be damaged by high intensity laser pulses, particularly at short wavelengths, so this embodiment can have a longer operating life and/or lower maintenance costs compared with ring cavities using AR coatings especially when used for multiplying the repetition rate of DUV and VUV lasers.

In one embodiment, the Brewster cut of the prism(s) is oriented for the beam polarization lies in the same ring-cavity plane, while in another embodiment the Brewster cut of the prism(s) is oriented for the beam polarization that is perpendicular to the ring-cavity plane.

In one embodiment, the beam is totally internally reflected twice in a single prism of appropriate design. Such a prism can replace two folding mirrors in a ring cavity, and so reduce the total number of components and simplify the process of aligning the ring cavity.

In one embodiment a right-angled prism is used in the ring cavity. It reflects the beam twice which sends the beam back in the opposite direction while also displacing it in space. This unique feature of the right-angled prism results in the flexibility to multiply the effective cavity length by simply rotating the right-angle prism to a specific angle. For example, two ring cavities may be constructed with similar physical lengths, but with one having an optical path length that is an integer multiple of (such as twice) the optical path length of the other so that the two ring cavities may be cascaded in order to multiply the pulse repetition rate by a larger factor then can be conveniently achieved in a single ring cavity.

In a preferred embodiment, the fraction of the energy of each input laser pulse that is directed into the ring cavity is controlled by selecting the angle of incidence and polarization relative to a surface to achieve the desired reflection and transmission coefficients. This has the advantage of avoiding the need for any coating on the surface and so avoids the possibility of coating damage caused by the peak power density of the laser pulses, which can be a problem particularly when the laser repetition rate multiplier is used with a deep UV or vacuum UV laser with an average power of hundreds of mW or greater. Such lasers are increasingly needed in semiconductor inspection and metrology systems in order to achieve the desired sensitivity and signal-to-noise ratio when inspecting or measuring features with dimensions of about 100 nm or smaller.

In a preferred embodiment, one or more lenses are used within the ring cavity to re-image each laser pulse such that it retains approximately the same shape and size each time it traverses the cavity. One embodiment uses Brewster's angle lenses without coatings to refocus each laser pulse, thus avoiding the risk of coating damage.

In a preferred embodiment, two or more of the above described features are combined in one laser repetition rate multiplier. For example, in one preferred embodiment a laser repetition rate multiplier comprises a ring cavity comprising three uncoated prisms wherein the laser beam inside the cavity is substantially p polarized relative to the surfaces of those prisms. Two of the prisms use total internal reflection to circulate the laser beam efficiently within the ring cavity. A third prism has a surface that is oriented so that the laser beam is approximately s polarized relative to that surface and the input pulses are incident at an angle chosen so that desired fraction each input pulse is directed into the ring cavity.

Wafer inspection systems, patterned wafer inspection systems, photomask inspection systems, and metrology systems incorporating a laser pulse multiplier are described. The compact size of the laser pulse multipliers described herein makes them relatively easy to incorporate into inspection and metrology systems. The use of uncoated optics in the laser pulse multiplier allows those inspection and metrology systems to operate with high powered deep UV lasers without performance degradation or maintenance issues due to coating damage.

BRIEF DESCRIPTION OF THE DRAWINGS

FIGS. 16A and 16B are front and side views showing a generator based on a 2× pulse repetition rate multiplier according to another embodiment.

FIGS. 16C and 16D are front and top views showing a generator based on a 2×/4× pulse repetition rate multiplier according to another embodiment.

FIGS. 27A and 27B illustrate exemplary repetition rate multipliers using 3 prisms without coatings and no separate beam splitter. As for the other embodiments using all uncoated optics, this repetition rate multiplier is particularly suitable for use in the deep UV because it avoids the possibility of coating damage by the laser pulses.

FIGS. 28, 28A, 28B and 28C illustrate details of the design of a first prism of FIG. 27A.

FIGS. 30, 30A and 30B illustrate details of the design of a second prism of FIG. 27A.

FIGS. 31, 31A, 31B and 31C illustrate details of the design of a third prism of FIG. 27A.

FIGS. 32A and 32B illustrate an alternative exemplary repetition rate multiplier using two prisms and a beam splitter, or one prism, one mirror and one beam splitter.

DETAILED DESCRIPTION OF THE DRAWINGS

Improved illumination systems for semiconductor inspection and measurement systems are described herein. The following description is presented to enable one of ordinary skill in the art to make and use the invention as provided in the context of a particular application and its requirements. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
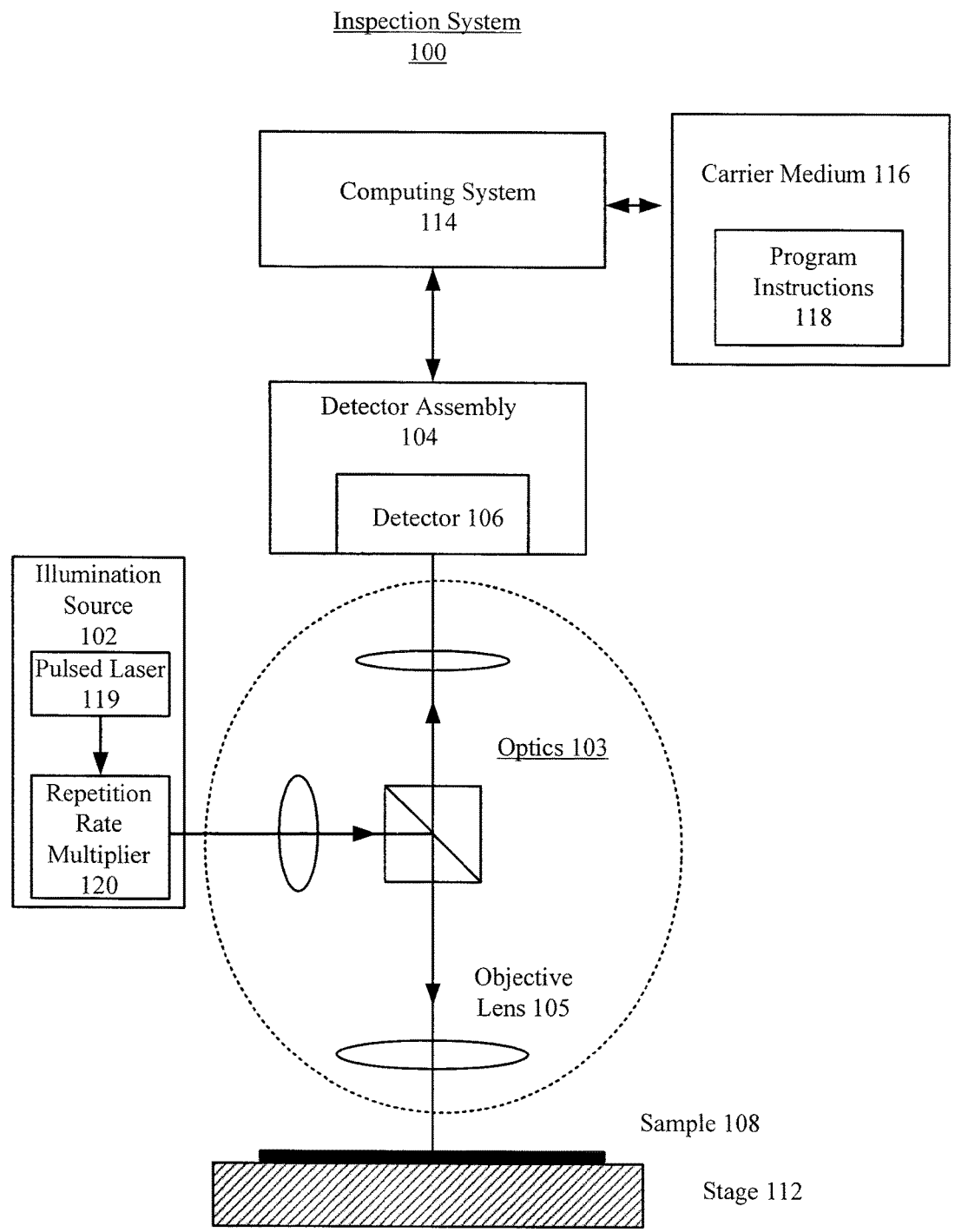
FIG. 1 illustrates an exemplary inspection or measurement system incorporating a pulsed laser and a laser pulse repetition rate multiplier which may also be configured as a flat-top profile generator.

FIG. 1 illustrates an exemplary inspection system 100 configured to inspect or measure a sample 108, such as a wafer, reticle, or photomask. Sample 108 is placed on a stage 112 to facilitate movement of different regions of sample 108 underneath the optics. Stage 112 may comprise an X-Y stage or an R-θ stage. In some embodiments, stage 112 can adjust the height of sample 108 during inspection to maintain focus. In other embodiments, an objective lens 105 can be adjusted to maintain focus.

An illumination source 102 comprises one or more pulsed lasers and a repetition rate multiplier as described herein. Illumination source 102 may emit DUV and/or VUV radiation. Optics 103, including an objective lens 105, directs that radiation towards and focuses it on sample 108. Optics 103 may also comprise mirrors, lenses, and/or beam splitters (not shown in detail for simplicity). Light reflected or scattered from sample 108 is collected, directed, and focused by optics 103 onto a detector 106, which is within a detector assembly 104.

Detector 106 may include a two-dimensional array sensor or a one-dimensional line sensor. In one embodiment, the output of detector 106 is provided to a computing system 114, which analyzes the output. Computing system 114 is configured by program instructions 118, which can be stored on a carrier medium 116.

Illumination source 102 includes a pulsed laser 119 and a repetition rate multiplier 120. In one embodiment, illumination source 102 may further include a continuous source, such as an arc lamp, a laser-pumped plasma light source, or a CW laser.

One embodiment of inspection system 100 illuminates a line on sample 108, and collects scattered and/or reflected light in one or more dark-field and/or bright-field collection channels. In this embodiment, detector 106 may include a line sensor or an electron-bombarded line sensor. In this embodiment repetition rate multiplier 120 within illumination source 102 may be configured to generate a flat-top profile so as to efficiently generate a substantially uniform line illumination.

Another embodiment of inspection system 100 illuminates multiple spots on sample 108, and collects scattered and/or reflected light in one or more dark-field and/or bright-field collection channels. In this embodiment, detector 106 may include a two-dimensional array sensor or an electron-bombarded two-dimensional array sensor.

Additional details of various embodiments of inspection system 100 are described in U.S. patent application Ser. No. 13/554,954 entitled "Wafer inspection system", filed on Jul. 9, 2012, U.S. Pat. No. 7,957,066 entitled "Split Field Inspection System Using Small Catadioptric Objectives", issued on Jun. 7, 2011, U.S. Pat. No. 7,345,825 entitled "Beam Delivery System For Laser Dark-field Illumination in a Catadioptric Optical System", issued on Mar. 18, 2008, U.S. Pat. No. 5,999,31, entitled "Ultra-Broadband UV Microscope Imaging System With Wide Range Zoom Capability", issued on Dec. 7, 1999, and U.S. Pat. No. 7,525,649 entitled "Surface Inspection System Using Laser Line Illumination With Two Dimensional Imaging", issued on Apr. 28, 2009. All of these patents are incorporated by reference herein.

Figure 2A:
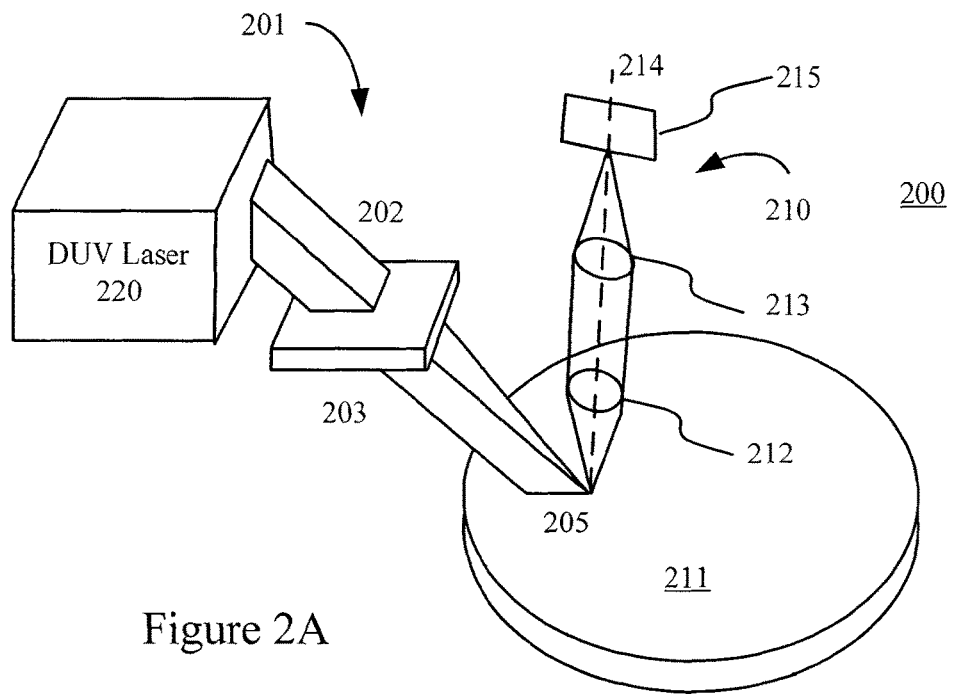
FIGS. 2A and 2B illustrates a dark-field inspection system that incorporates a repetition rate multiplier which may also be configured as a flat-top profile generator.
Figure 2B:
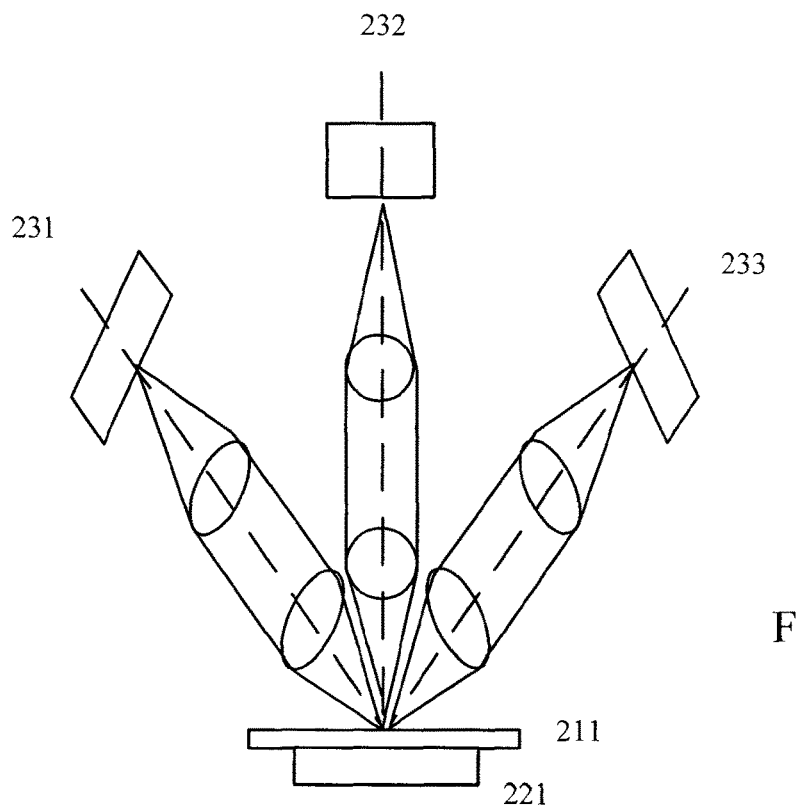

FIGS. 2A and 2B illustrate aspects of a dark-field inspection system 200 that incorporates a repetition rate multiplier and/or a repetition rate multiplication method described herein in accordance with other exemplary embodiments of the present invention. In FIG. 2A, illumination optics 201 comprises a laser system 220, which generates light 202 that is focused by a mirror or lens 203 into a line 205 on surface of a wafer or photomask (sample) 211 being inspected. Collection optics 210 directs light scattered from line 205 to a sensor 215 using lenses and/or mirrors 212 and 213. An optical axis 214 of collection optics 210 is not in the illumination plane of line 205. In some embodiments, optical axis 214 is approximately perpendicular to line 205. Sensor 215 comprises an array sensor, such as a linear array sensor. Laser system 220 incorporates one or more of the repetition rate multipliers and/or repetition rate multiplication methods described herein. Laser system 220 may be configured to efficiently generate a flat-top profile in accordance with an embodiment of the present invention so that the time-averaged light intensity along line 205 may be substantially uniform.

FIG. 2B illustrates one embodiment of multiple dark-field collection systems 231, 232 and 233, each collection system substantially similar to collection optics 210 of FIG. 2A. Collection systems 231, 232 and 233 may be used in combination with illumination optics substantially similar to illumination optics 201 of FIG. 2A. Sample 211 is supported on stage 221, which moves the areas to be inspected underneath the optics. Stage 221 may comprise an X-Y stage or an R-θ stage, which preferably moves substantially continuously during the inspection to inspect large areas of the sample with minimal dead time.

More details of inspection systems in accordance with the embodiments illustrated in FIGS. 2A and 2B are described in U.S. Pat. No. 7,525,649, entitled "Surface inspection system using laser line illumination with two dimensional imaging", issued on Apr. 28, 2009, and U.S. Pat. No. 6,608,676, entitled "System for detecting anomalies and/or features of a surface", issued on Aug. 19, 2003. Both of these patents are incorporated by reference herein.

Figure 3:
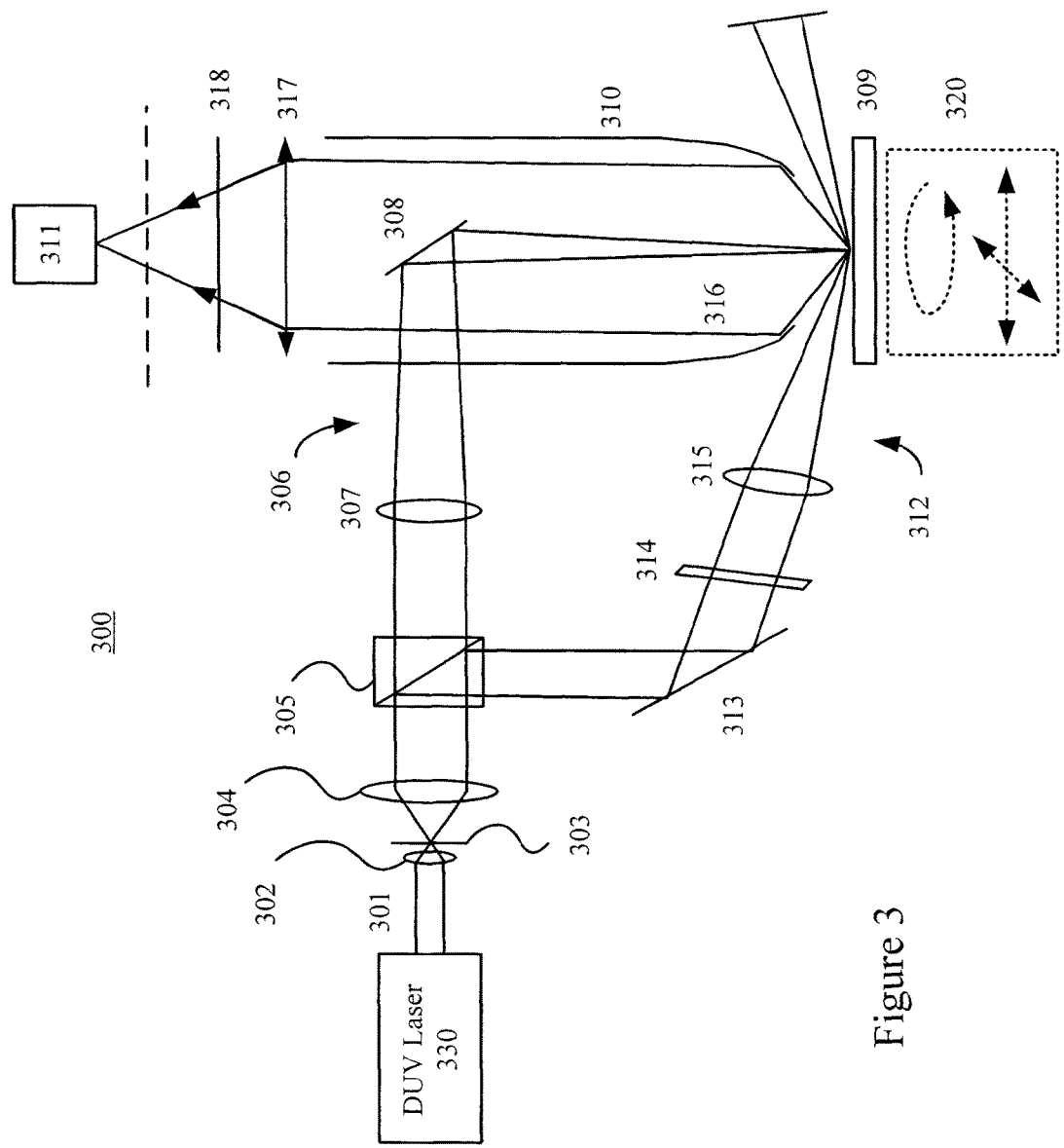
FIG. 3 illustrates an inspection system configured to detect particles or defects on a sample using both normal and oblique illumination beams which can also benefit from incorporating a repetition rate multiplier which may also be configured as a flat-top profile generator.

FIG. 3 illustrates an inspection system 300 configured to detect particles or defects on a sample using both normal and oblique illumination beams. In this configuration, a laser system 330 provides a laser beam 301. Laser system 330 comprises a pulsed laser and a repetition rate multiplier as described herein. A lens 302 focuses beam 301 through a spatial filter 303. Lens 304 collimates the beam and conveys it to a polarizing beam splitter 305. Beam splitter 305 passes a first polarized component to the normal illumination channel and a second polarized component to the oblique illumination channel, where the first and second components are orthogonal. In a normal illumination channel 306, the first polarized component is focused by optics 307 and reflected by a mirror 308 towards a surface of a sample 309. The radiation scattered by sample 309 (such as a wafer or photomask) is collected and focused by a paraboloidal mirror 310 to a sensor 311.

In an oblique illumination channel 312, the second polarized component is reflected by a beam splitter 305 to a mirror 313 which reflects such beam through a half-wave plate 314 and focused by optics 315 to sample 309. Radiation originating from the oblique illumination beam in oblique channel 312 and scattered by sample 309 is collected by paraboloidal mirror 310 and focused to sensor 311. Sensor 311 and the illuminated area (from the normal and oblique illumination channels on sample 309) are preferably at the foci of paraboloidal mirror 310.

Paraboloidal mirror 310 collimates the scattered radiation from sample 309 into a collimated beam 316. Collimated beam 316 is then focused by an objective 317 and through an analyzer 318 to sensor 311. Note that curved mirrored surfaces having shapes other than paraboloidal shapes may also be used. An instrument 320 can provide relative motion between the beams and sample 309 so that spots are scanned across the surface of sample 309.

U.S. Pat. No. 6,201,60, entitled "Sample Inspection System", issued on Mar. 13, 2001, and U.S. patent application Ser. No. 13/544,954 entitled "WAFER INSPECTION SYSTEM", filed on Jul. 9, 2012 by Romanovsky et al., both of which are incorporated by reference herein, describe inspection system 300 in further detail.

Figure 4:
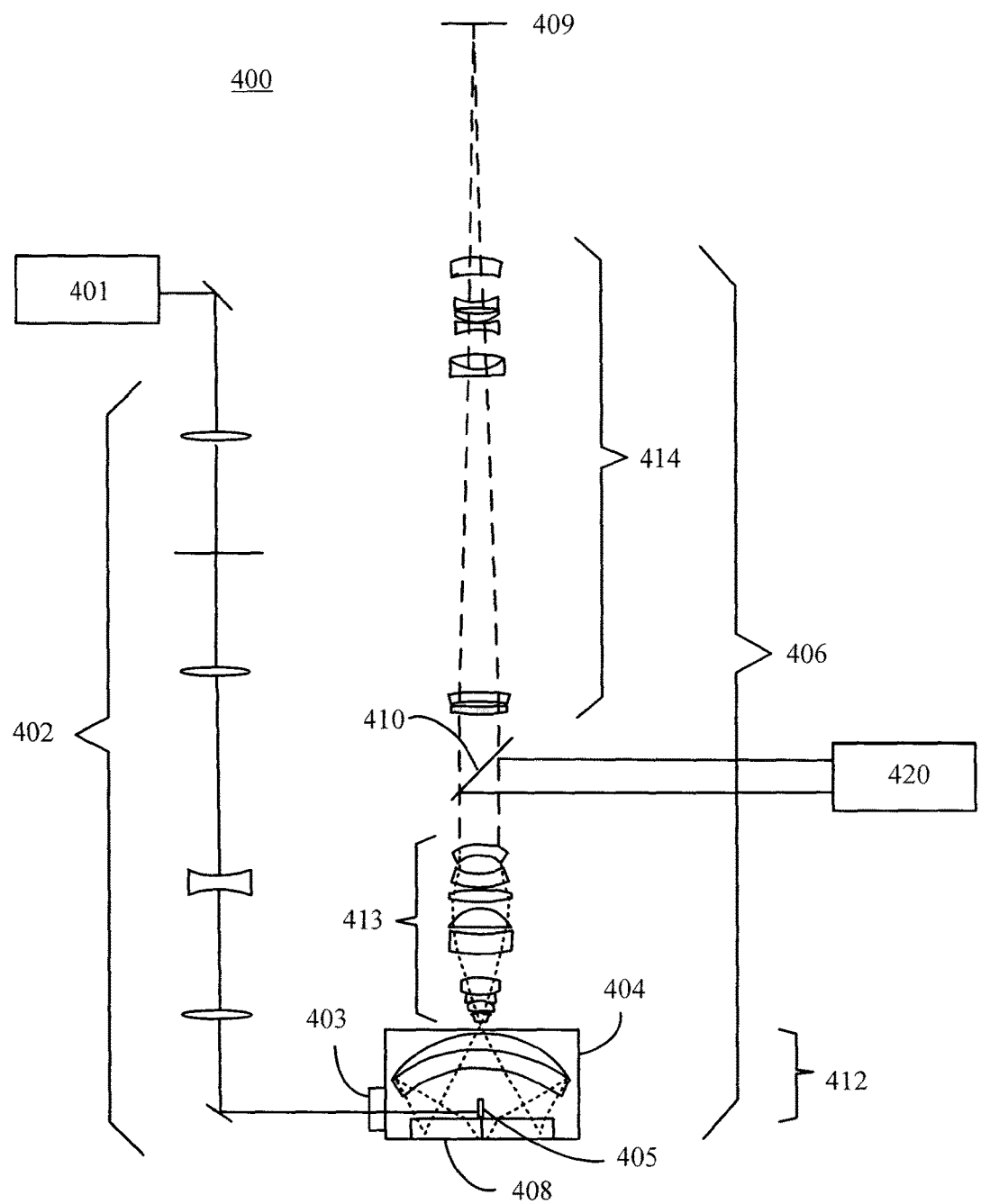
FIG. 4 an exemplary catadioptric imaging system configured as an inspection system with bright-field and dark-field inspection modes which can advantageously incorporate a repetition rate multiplier which may also be configured as a flat-top profile generator.

FIG. 4 illustrates an exemplary catadioptric imaging system 400 configured as an inspection system with bright-field and dark-field inspection modes. System 400 incorporates two illuminations sources: a laser 401 and a broad-band light illumination module 420. Laser 401 comprises a pulsed laser and a repetition rate multiplier as described herein. In preferred embodiments, laser 401 comprises a DUV or VUV laser, a pulse repetition rate multiplier and/or a flat-top profile generator as described herein.

In a dark-field mode, adaptation optics 402 control the laser illumination beam size and profile on the surface being inspected. A mechanical housing 404 includes an aperture and window 403, and a prism 405 to redirect the laser along the optical axis at normal incidence to the surface of a sample 408. A prism 405 also directs the specular reflection from surface features of sample 408 out of an objective 406. Objective 406 collects light scattered by sample 408 and focuses it on a sensor 409. Lenses for objective 406 can be provided in the general form of a catadioptric objective 412, a focusing lens group 413, and a tube lens section 414, which may, optionally, include a zoom capability.

In a bright-field mode, a broad-band illumination module 420 directs broad-band light to a beam splitter 410, which reflects that light towards focusing lens group 413 and catadioptric objective 412. Catadioptric objective 412 illuminates sample 408 with the broadband light. Light that is reflected or scattered from the sample is collected by objective 406 and focused on sensor 409. Broad-band illumination module 420 comprises, for example, a laser-pumped plasma light source or an arc lamp. Broad-band illumination module 420 may also include an auto-focus system to provide a signal to control the height of sample 408 relative to catadioptric objective 412.

U.S. Pat. No. 7,245,825 entitled "Beam Delivery System For Laser Dark-Field Illumination in a Catadioptric optical system", issued on Mar. 18, 2008 and incorporated by reference herein, describes system 400 in further detail.

Figure 5:
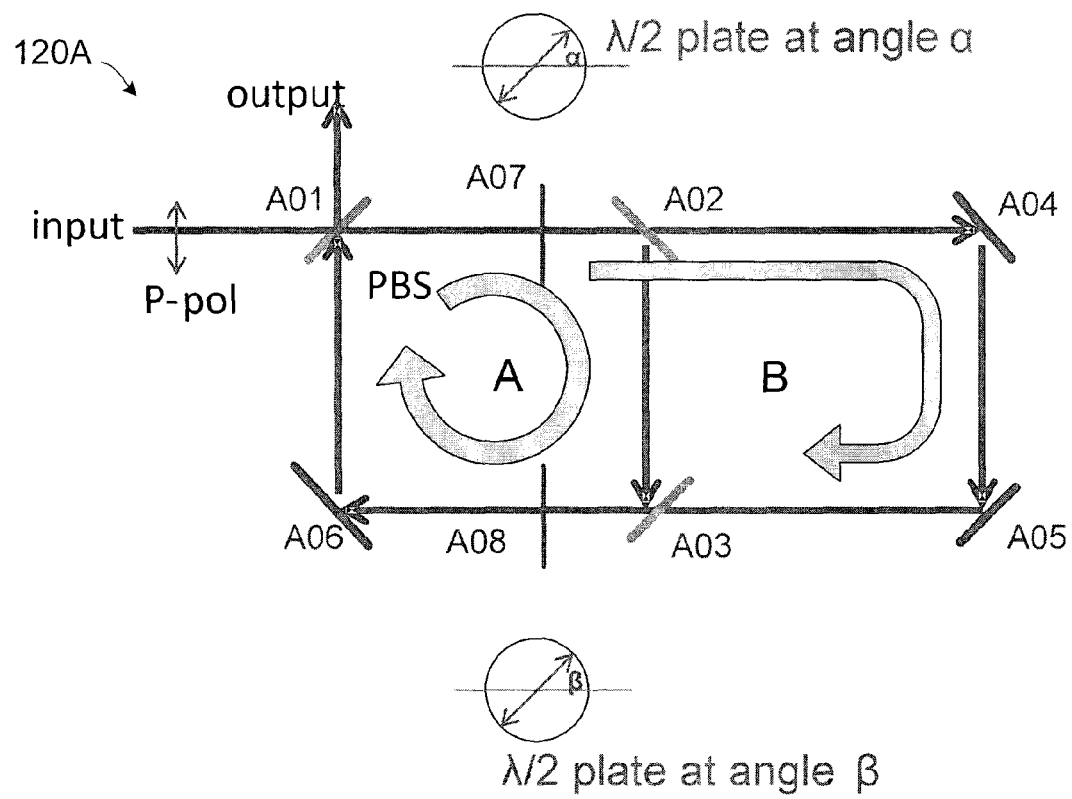
FIG. 5 illustrates an exemplary repetition rate multiplier that generates an output pulse train that has a pulse repetition rate that is three times that of the input pulses.

FIG. 5 illustrates an exemplary pulse repetition rate multiplier 120A configured to receive input laser pulses (input), and to generate a pulse train (output) with a repetition rate that is three times that of the input laser pulses. Similar to the scheme described in the above cited '075 U.S. patent application, a polarized beam splitter (PBS) A01 serves as the input and output coupler of a ring cavity. The input laser is p polarized relative to PBS A01. PBS A01 is designed and oriented so as to receive the input laser pulse, to pass p polarization and reflect s polarization. Two additional PBS (A02 and A03) and three folding mirrors (A04, A05, A06) form a dual cavity. The dual cavity also includes two half-wave plates: one is placed between A01 and A02, while another one is placed between A03 and A06. When a laser pulse enters the dual cavity through PBS A01, it will be divided into two pulses by PBS A02. One part of the pulse is reflected from PBS A02 to PBS A03, directed from PBS A03 to mirror A06, then reflected from mirror A06 back to PBS A01 (shown as loop A). The other part of the pulse is transmitted through PBS A02 to mirror A04, reflected from mirror A04 to mirror A05, reflected from mirror A05 through A03 to mirror A06, then reflected from mirror A06 back to PBS A01 (shown as loop B). Repetition rate multiplier 120A also includes a first wave plate A07 for changing a polarization of the input laser pulse portion passed from PBS A01 to PBS A02, and a second wave plate A08 for changing a polarization of input laser pulse portions passed from PBS A03 to mirror A06. The laser pulse energy distribution between loop A and loop B can be controlled by the angle of the principle axis of half-wave plate A07 relative to the polarization of the input laser pulse. By selecting the angle of the principle axis of half-wave plate A08, one can control the ratio of the pulse energy recycled into the dual cavity to the energy that exits the dual cavity through PBS A01.

In one preferred embodiment, the optical path length of loop A is set to approximately one-third of the pulse-to-pulse distance of input laser pulses, and path length of loop B is set to approximately twice that of loop A. This results in output pulses at approximately one third and two thirds of the time interval between input laser pulses and approximately coincident with the input pulses, thus tripling the repetition rate of the laser. In this embodiment, preferably the angles α and β of the principal axes of wave plates A07 and A08 respectively are set to be either approximately α=29° and β=16°, respectively, or approximately α=16° and β=29°, respectively, so as to produce approximately equal energy in each output pulse. If small differences (such as a few percent) in the energy of each pulse are acceptable in a specific application, then angles that differ from these values by one or two degrees may be acceptable. Lenses (not shown) may be incorporated into the dual cavity and/or one of more of mirrors A04, A05 and A06 may be curved such that the Gaussian beam waist and size of each pulse is re-imaged to the same condition when it returns to the same position.

Repetition rates other than three are possible with this dual cavity. For example Loop A may be set to have an optical path length equal to approximately one quarter of the separation of input pulses, and Loop B may be set to be approximately twice the length of Loop A. This would result in quadrupling the repetition rate of the input laser pulses. However such a scheme cannot generate equal output pulse energies and so would only be useful when equal output pulse energies are not required.

Figure 6:
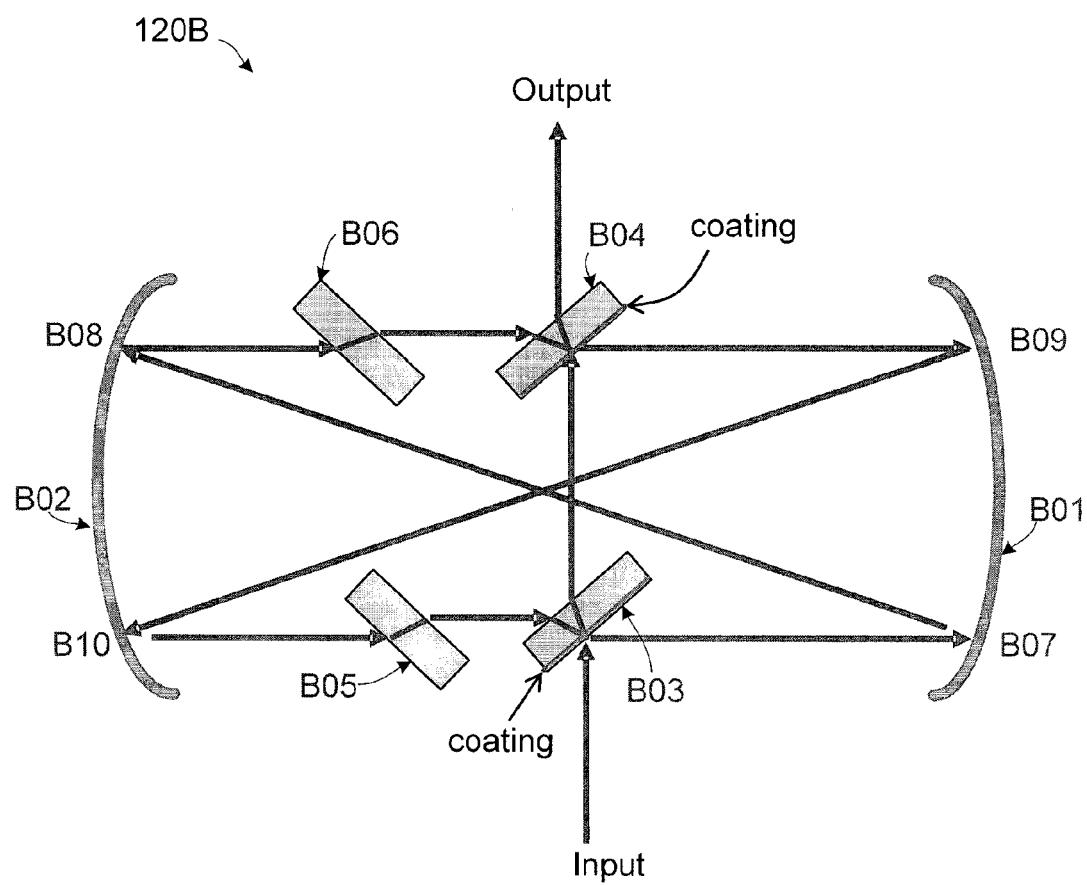
FIG. 6 illustrates another exemplary repetition rate multiplier embodiment that also generates an output pulse train that has a repetition rate that is three times that of the input pulses.

FIG. 6 illustrates another pulse repetition rate multiplier 120B that can triple the repetition rate. Similar to the Herriott cell scheme described in the above cited '593 U.S. patent application, this pulse repetition rate tripler comprises an optical cavity formed by a pair of curved mirrors (B01 and B02). Curved mirrors B01 and B02 are preferably spherical mirrors. Pulse repetition rate tripler 120B further comprises two beam splitters (B03, B04) and two beam compensators (B05, B06). The radii of curvature of the two curved mirrors B01 and B02 should, preferably, both be substantially equal to the distance between them (i.e. the cavity should be confocal).

Laser input pulses (input) arrive at beam splitter B03. Part of the energy of each pulse is reflected from beam splitter B03 to point B07 on curved mirror B01, then to point B08 on curved mirror B02, through beam splitter B04 to point B09 on curved mirror B01, then to point B10 on curved mirror B02, and back to beam splitter B03. The other part of the energy of each pulse is transmitted through beam splitter B03, to beam splitter B04 where it is reflected to point B09 on curved mirror B01, then to point B10 on curved mirror B02, and back to beam splitter B03. In preferred embodiments, the optical path length of the shorter loop (B03-B04-B09-B10-B03) is approximately half of that of the longer one (B03-B07-B08-B04-B09-B10-B03). When the distance between the two curved mirrors B01 and B02 is approximately one-sixth of the original pulse-to-pulse spatial separation of input laser beam, the output pulse train will have triple the repetition rate of the input pulses. Beam compensators B05 and B06 have optical thicknesses and orientations chosen so as to substantially compensate for the displacement of the laser beam within the cavity caused by beam splitters B03 and B04 respectively.

Similar to the output of the 2× repetition rate multiplier described in the above-cited '593 application and illustrated in FIGS. 2A and 2B of that application, the output of pulse repetition rate tripler 120B consists of a series of pulse trains, each pulse train comprising a series of pulses that have traversed one or both of the cavities one or more time. Pulse repetition rate tripler 120B has three output pulse trains per input pulse compared with two output pulses per input pulse for the 2× repetition rate multiplier. In a preferred embodiment of the pulse repetition rate tripler, the total energies in each output pulse train are made approximately equal to one another by setting the reflectivities of beam splitters B03 and B04 to be approximately equal to $$\frac{1}{10}(5-\sqrt{5}) \text{ and } \frac{1}{10}(5+\sqrt{5}),$$

i.e. approximately 0.28 and approximately 0.72. Note that either B03 can have a reflectivity of approximately 0.28 and B04 can have a reflectivity of approximately 0.72, or B04 can have a reflectivity of approximately 0.28 and B03 can have a reflectivity of approximately 0.72. Both configurations produce substantially equal output pulse energies. Since pulse-to-pulse energy variations of a few percent may be acceptable in many inspection applications, the beam splitter reflectivities may be chosen to have values that differ by a few percent from 0.28 and 0.72. As one skilled in the relevant arts understands, the reflectivity of a beam splitter can be controlled by the selection of the beam splitter material, the thickness(es) and material(s) of any layer or layers coated on the surface, and the angle of incidence on the beam splitter.

Figure 7A:
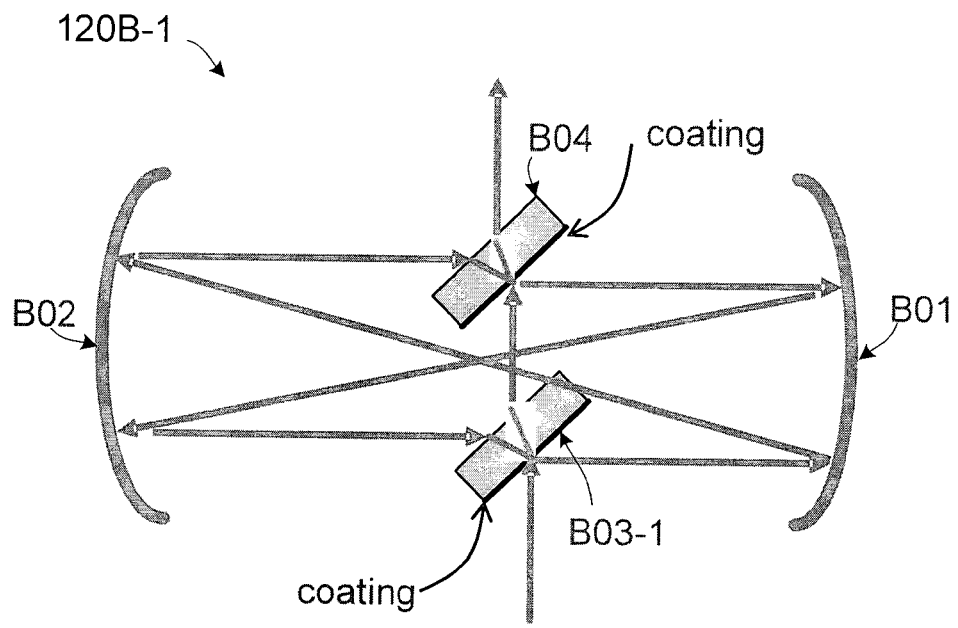
FIGS. 7A and 7B illustrate exemplary repetition rate multipliers similar to the one shown in FIG. 6 except that no beam compensator is used.
Figure 7B:
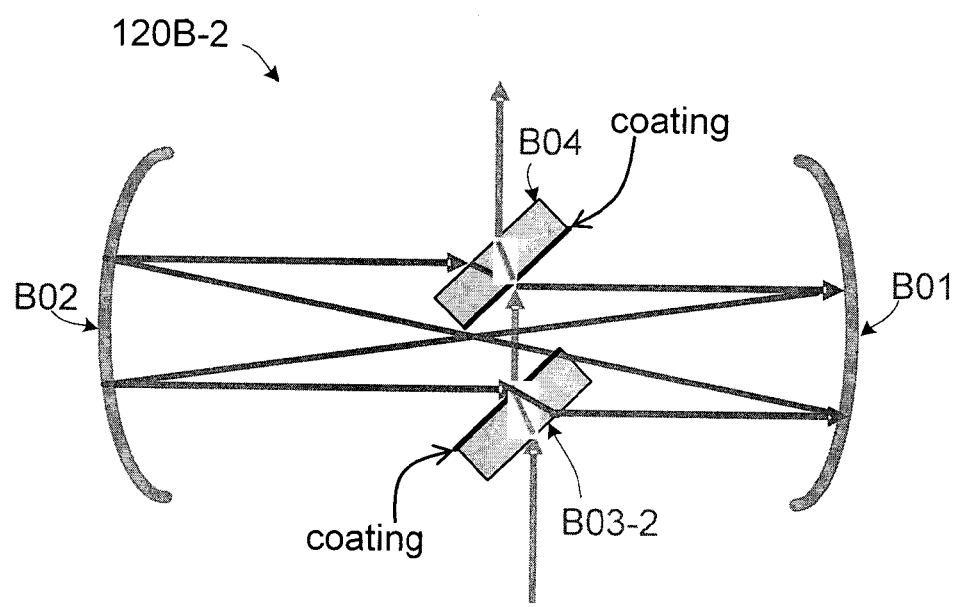

FIG. 7A illustrates a repetition rate multiplier 120B-1 according to another embodiment that utilizes curved mirrors (B01 and B02) and beam splitters in a manner similar to that illustrated in FIG. 6, but differs in that the two beam compensators (B05 and B06, see FIG. 6) are removed. FIG. 7A shows that with proper adjustment of the positions of beam splitters B03-1 and B04, the beam displacement caused by one of the beam splitters can be compensated by the other beam splitter and vice versa. Preferably the two beam splitters B04 and B03-1 have substantially equal optical thicknesses. FIG. 7B illustrates a repetition rate multiplier 120B-2 according to another embodiment where beam splitter B03-2 is placed with its coated side flipped to the other direction with respect to beam splitter B03-1 of FIG. 7A. In either embodiment, a closed loop can exist and no beam compensator is needed.

Figure 8:
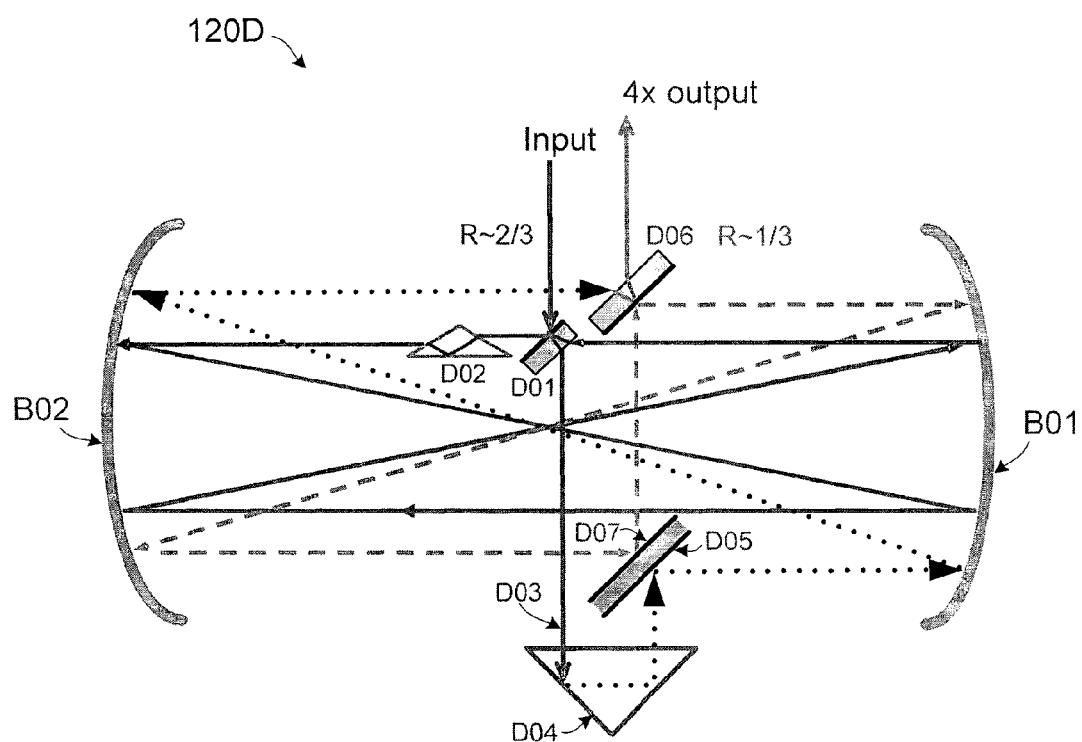
FIG. 8 illustrates an exemplary repetition rate multiplier that generates an output pulse train with a repetition rate that is four times that of the input pulses.

FIG. 8 illustrates another repetition rate multiplier 120D which can quadruple the repetition rate. Repetition rate multiplier 120D comprises an optical cavity formed by two curved mirrors B01 and B02 similar to those described above with reference to FIG. 6, two beam splitters D01 and D06, and two fold mirrors D05 and D07. The input laser repetition rate gets doubled first in a manner similar to that described in the above cited '593 U.S. patent application, by using one beam splitter D01 (preferably with a reflectivity of approximately $2/3$), and one beam compensator or prism D02 (the primary cavity loop). After that, the output beam D03 gets diverted back to the cavity by right-angled prism D04 and a mirror D05. The beam then reaches another beam splitter D06 (preferably with a reflectivity of approximately $1/3$) along the path shown as a dotted line, and starts the secondary cavity loop (dashed lines) from D06, to spherical mirror B01, spherical mirror B02, then another flat mirror D07, and back to beam splitter D06. The length of this secondary cavity path loop is approximately half that of the first loop, thus it doubles the repetition rate a second time and makes an output pulse train at four times the initial input pulse repetition rate.

A special feature of this scheme is that this secondary cavity loop, which further multiplies the repetition rate a second time, utilizes same set of curved mirrors (B01 and B02) as the first cavity loop. In addition, the flat mirrors D05 and D07 can be combined into one optical element with high reflectivity (HR) coatings on both sides. These features give rise to a more compact footprint as compared with a setup comprising two individual 2× pulse multipliers cascaded together. Note that, though convenient, it is not required to combine mirrors D07 and D05, and the beam D03 may be directed along a different path from that shown to arrive at beam splitter D06. Alternative layouts are possible and are within the scope of this embodiment.

Figure 9:
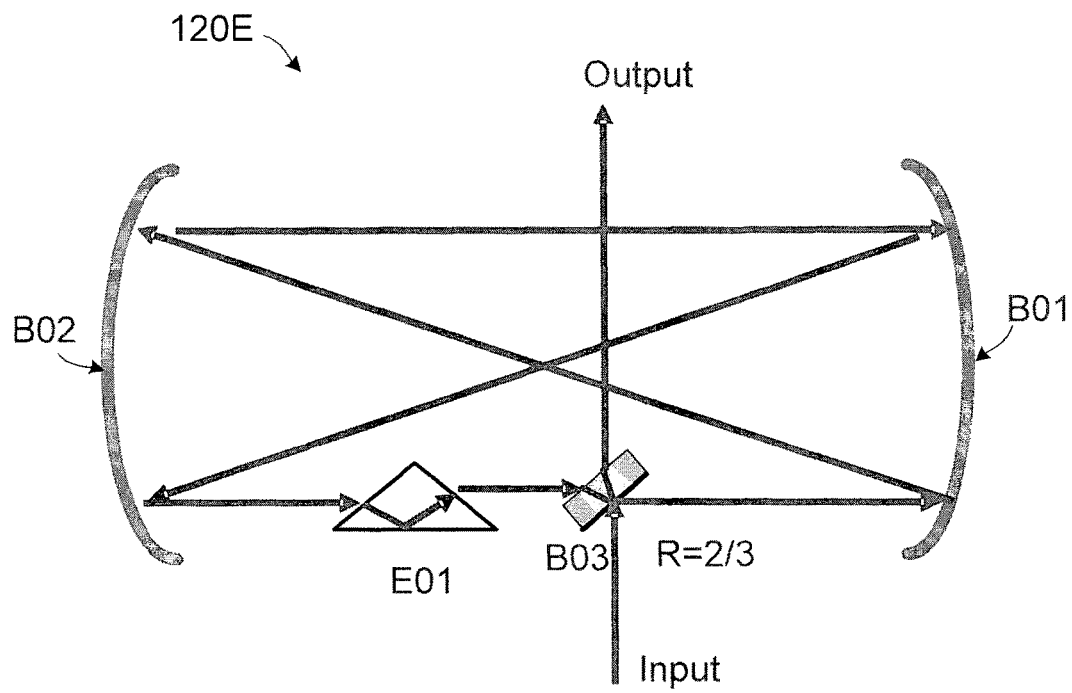
FIG. 9 illustrates an exemplary 2× pulse repetition rate multiplier, which uses an isosceles triangle prism instead of a plate beam compensator.

FIG. 9 illustrates another repetition rate multiplier 120E which doubles the repetition rate as discussed previously. Repetition rate multiplier 120E comprises an optical cavity formed by curved mirrors B01 and B02 and a beam splitter B03 in a manner similar to that described above with reference to FIG. 6. An isosceles triangle prism E01 is used here to replace the compensator B05 from the previous embodiment.

Figure 10A:
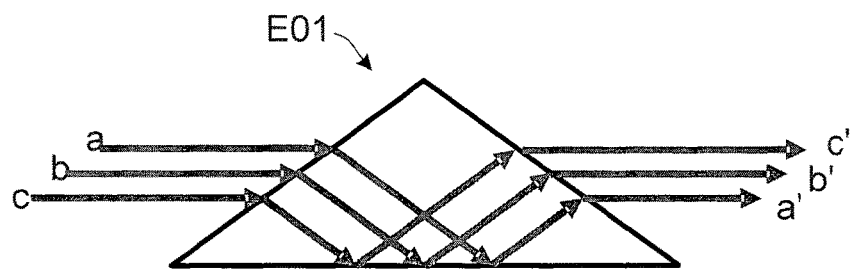
FIGS. 10A and 10B illustrate the features of an isosceles triangle prism including shifting the beam and reversing the spatial sequence of the beams.
Figure 10B:
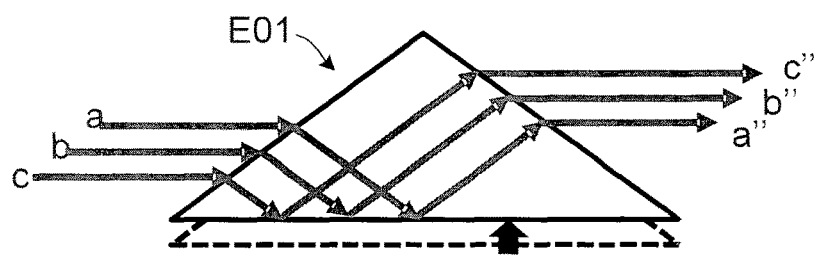

FIGS. 10A and 10B illustrate useful features of isosceles triangle prism E01: (1) it shifts the beam and the amount of shift is adjustable by laterally moving the prism, and (2) if multiple beams go into the prism in parallel, the spatial sequence of output beams will be reversed. This isosceles triangle prism can also be implemented as an isosceles trapezoid or as a Dove prism.

Figure 11A:
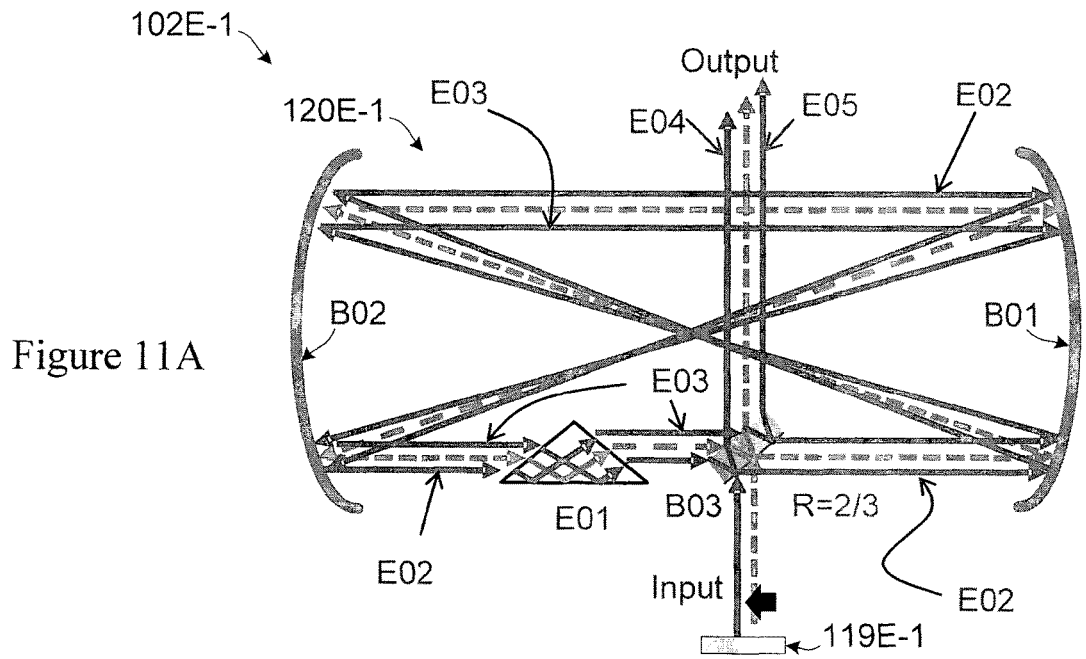
FIG. 11A illustrates an exemplary embodiment which generates a flat-top output beam profile by shifting the input beam illustrated in FIG. 9.
Figure 11B:
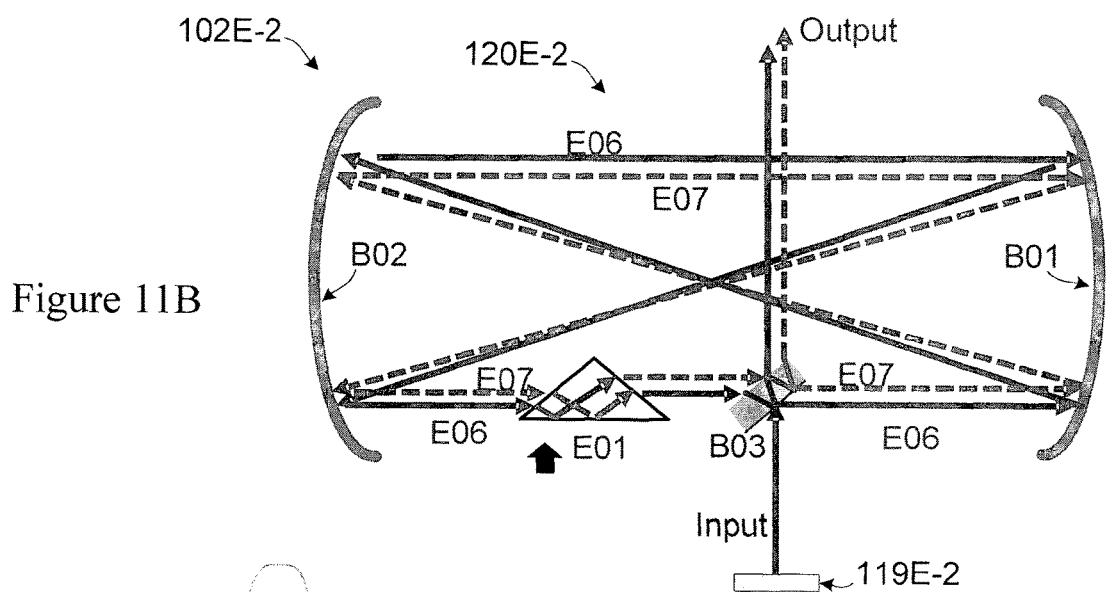
FIG. 11B illustrates another exemplary embodiment which generates a flat-top profile by shifting the prism towards the cavity axis.

FIG. 11A and FIG. 11B illustrate two similar flat-top beam generators 102E-1 and 102E-2 according to exemplary embodiments that respectively utilize repetition rate multipliers 120E-1 and 120E-2 to split the input laser pulses (input) received from lasers 119E-1 and 119E-2 into two laterally displaced (separate round-trip optical) output beam paths, thereby creating output laser pulses (output) having time-averaged flat-top beam profiles with a pulse repetition rate that is double (two times) the pulse repetition rate of the input laser pulses. Repetition rate multipliers 120E-1 and 120E-2 include two spherical/cavity (curved) mirrors B01 and B02, a beam splitter B03, and isosceles triangle prism E01 arranged in a manner similar to the embodiment described above with reference to FIG. 9. FIG. 11A shows the nominal optical path of FIG. 9 as a dotted line. In the embodiment shown in FIG. 11A, the beam in the cavity is shifted to route E02 by a small displacement of the input beam (e.g., by displacing laser 119E-1 in the direction indicated by the thick arrow at the bottom of FIG. 11A). After a laser pulse has completed one trip around the cavity on path E02, prism E01 laterally displaces the laser pulse to a path E03 on the opposite side of the nominal route. A pulse on route E03 gets switched to route E02 again when it arrives back at prism E01. Therefore, the laser pulses will alternate between routes E02 and E03.

Figure 12:
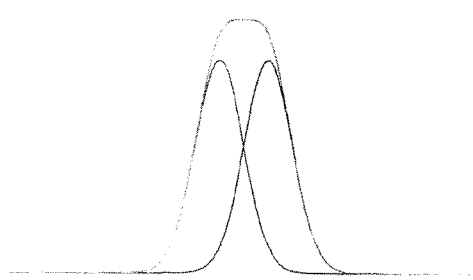
FIG. 12 illustrates a flat-top profile formed by two partially overlapped Gaussian beams.

Each time a laser pulse encounters beam splitter B03, part of the energy of the pulse gets reflected and exits the system. A pulse traveling on route E02 generates a pulse on exit route E04, and a pulse on route E03 generates a pulse on exit route E05. With this setup, one Gaussian beam splits into two spatially. By controlling the separation between E04 and E05, the degree of overlap between these two laser beams can be controlled. In a preferred embodiment the output beam profile possess an approximately flat-top time-averaged intensity, as illustrated in FIG. 12. An approximately flat top output beam profile can be created by displacing one Gaussian with respect to the other by approximately 0.5 times the beam waist radius (i.e. the radius at which the beam power density is $1/e^2$ of its peak value, or equivalently the radius at which beam amplitude is $1/e$ of its peak value). This flat-top profile is very desirable in many applications which a homogenized spatial power distribution is required. Note that, because laser pulses on paths E04 and E05 leave the cavity at times separated by much longer than a duration of an individual pulse (such as separated in time by approximately half the time interval between input laser pulses), there is no interference of one pulse with another resulting in the desired relatively flat-top profile. Interference between the two displaced Gaussians, which could occur without a long enough time delay between the pulses, could cause a non-flat top of the profile.

FIG. 11B illustrates flat-top beam generator 102E-2 with repetition rate multiplier 120E-2 configured according to another exemplary embodiment to generate laser pulses (output) having a flat-top beam profile. Instead of offsetting the input beam by shifting the position of laser 119E-2, prism E01 is shifted toward the cavity axis (as indicated by the thick arrow at the bottom of the figure) and thus diverts pulses from nominal route E06 (solid line) to new route E07 (dashed line). Each pulse will then go back and forth (i.e., laterally displace) between routes E06 and E07 every time it travels through prism E01 after a cavity round trip. Similar to the embodiment in FIG. 11A, two output beams will be generated when the pulses go through beam splitter B03 under two different routes and a time-averaged flat-top beam profile can be formed by proper adjustment of the beam separation.

The above-mentioned repetition rate multipliers 120E-1 and 120E-2, which facilitate the flat-top schemes shown in FIG. 11A and FIG. 11B, are based on a scheme that doubles the repetition rate (e.g., the arrangement described above with reference to FIG. 9). Therefore, it has the advantage that one optical cavity not only spreads out the laser pulse energy distribution in the time domain but also homogenizes the energy distribution in the spatial domain.

Figure 13:
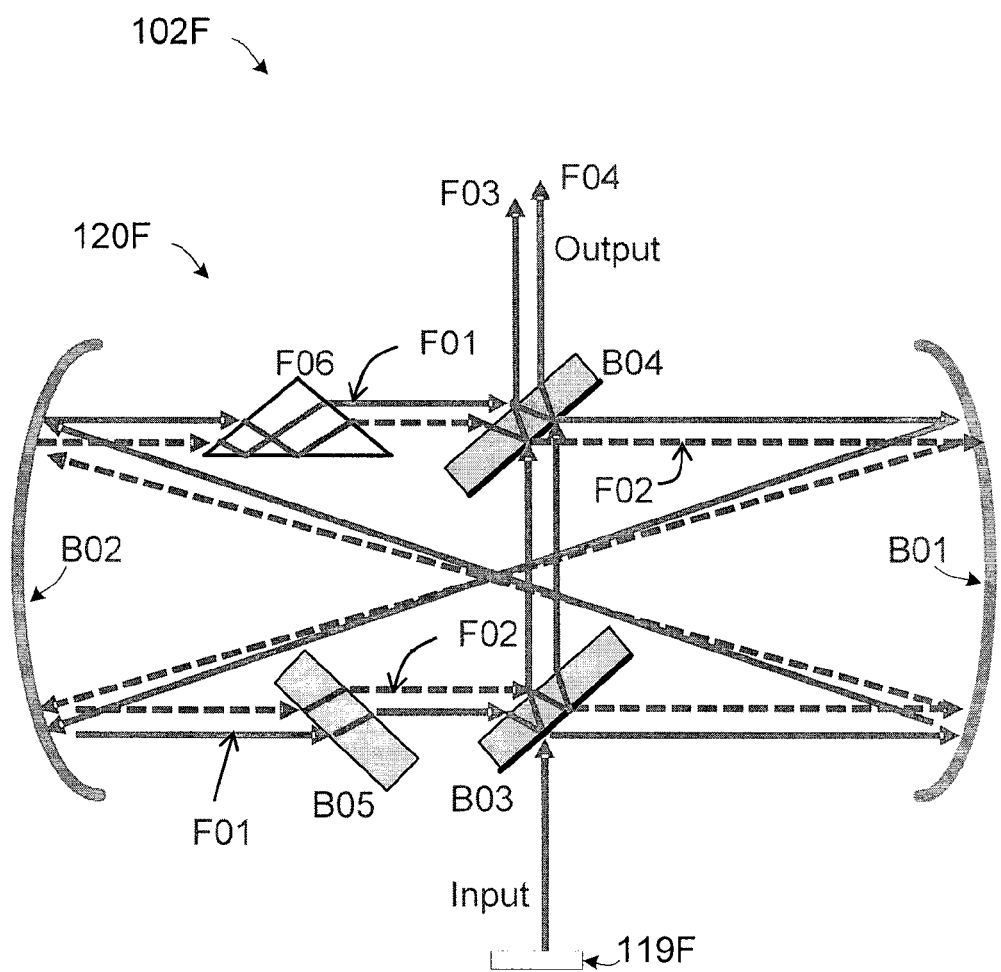
FIG. 13 illustrates an exemplary flat-top profile generator based on the 3× pulse repetition rate multiplier scheme shown in FIG. 6 where at least one plate compensator is replaced by a prism.

FIG. 13 illustrates another flat-top beam generator 102F according to another embodiment that utilizes repetition rate multiplier 120F to receive input laser pulses generated by a laser 119F, and to generate output laser pulses F03 and F04 having a time-averaged flat-top beam profile using a 3× pulse repetition rate multiplying system similar to that described above and illustrated in FIG. 6. In this embodiment beam splitter B04 is displaced downward from its nominal position (compare with FIG. 6) and an isosceles or Dove prism F06 is used in place of beam compensator B06 to laterally displace the beams in the manner described above, thus generating two beam paths. A laser pulse switches between outer route F01 (solid line) and inner route F02 (dashed line) every time when the pulse goes through the path between beam splitter B03 and B04 (perpendicular to cavity axis) and when it passes prism F06. When a laser pulse encounters beam splitter B04, part of the energy of the pulse will go out of the system. In a preferred embodiment, the beam splitter reflectivities are selected such that the average output power of F03 is approximately equal to the average output power of F04. In one preferred embodiment, where beam splitter losses are minimal, the beam splitter reflectivities are chosen so that approximately $$R_{B04} = \frac{R_{B03}}{4R_{B03} - 1},$$

where $R_{B03}$ and $R_{B04}$ are the reflectivities of beam splitter B03 and B04 respectively. Preferably the thicknesses of both beam splitters and the beam compensator are all equal so that it is straightforward to align the optics to achieve two closed loops within the optical cavity.

Figure 14A:
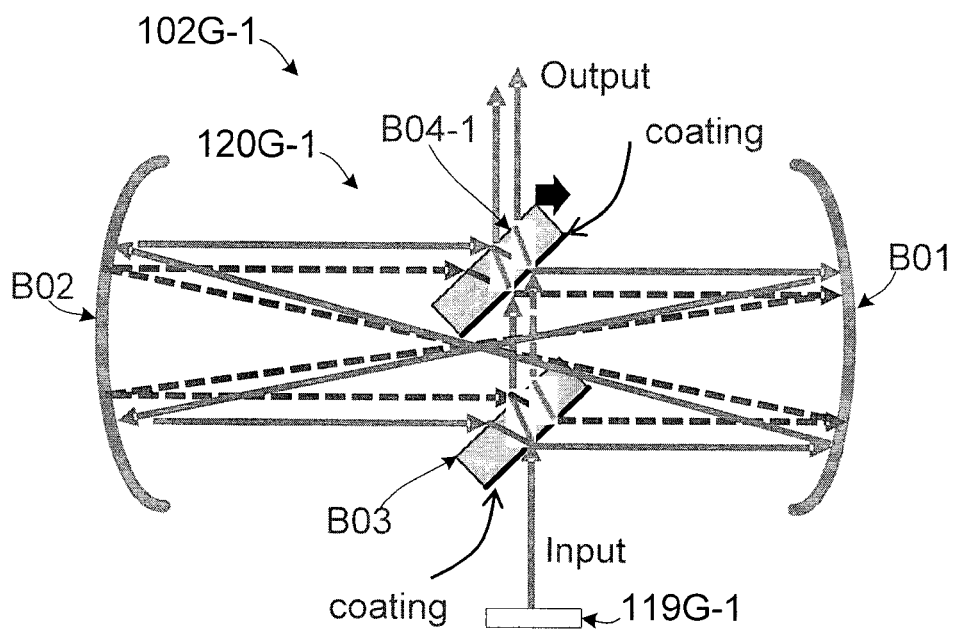
FIG. 14A illustrates an exemplary flat-top profile generator based on the 3× pulse repetition rate multiplier scheme shown in FIG. 7A.
Figure 14B:
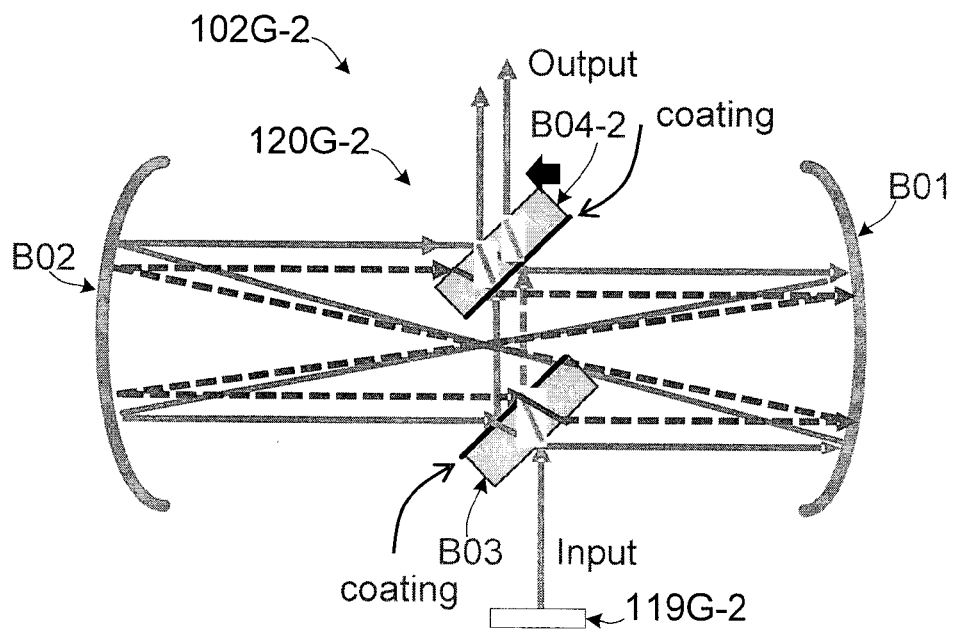
FIG. 14B illustrates another exemplary flat-top profile generator based on 3× pulse repetition rate multiplier scheme shown in FIG. 7B.

Alternatively, FIGS. 14A and 14B illustrate exemplary flat-top beam generators 102G-1 and 102G-2 according other embodiments that utilize repetition rate multipliers 120G-1 and 120G-2, respectively, having configurations similar to FIG. 13 but without using any beam compensator or prism, which receive input laser pulses generated by lasers 119G-1 and 119G-2, respectively, and to generate output laser pulses (output) having flat-top beam profiles. With proper arrangement of the beam splitter positions (e.g., by moving beam splitter B04-1 to the right as indicated in FIG. 14A, or by moving beam splitter B04-2 to the left as indicated in FIG. 14B), the generation of flat-top beam profiles without using any compensator or prism is possible in 3× multiplier-based scheme. In addition, the coatings of beam splitters can be either facing to different directions (FIG. 14A) or facing toward the same direction (FIG. 14B). You can also view the embodiments in FIGS. 14A and 14B as derivations of the arrangements shown in FIGS. 7A and 7B with one of the beam splitters offset in location, which causes the beam to be split into two and, hence with the appropriate offset, generate a time-averaged flat-top output profile.

Figure 15A:
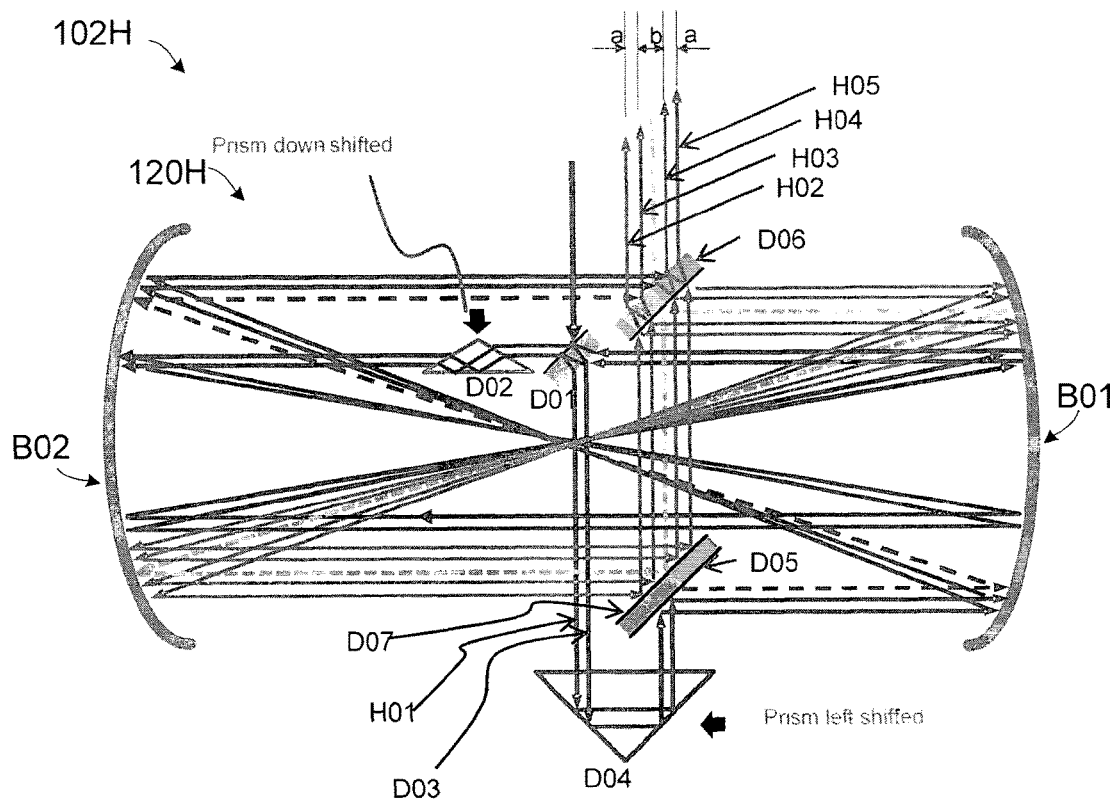
FIG. 15A illustrates another exemplary flat-top profile generator based on the 4× pulse repetition rate multiplier scheme shown in FIG. 8.

FIG. 15A illustrates another exemplary flat-top beam generator 102H that utilizes a 4× repetition rate multiplier 120H having a scheme similar to that shown in FIG. 8 (referred to as the 'nominal' here). This embodiment can generate a broader, flatter output profile than the 3× repetition rate multipliers. By utilizing the mechanism illustrated in FIG. 11B, shifting the prism D02 downward induces the first-stage output beam D03 to split into two (D03 and H01). Further, moving the prism D04 toward left side shifts the split beams D03 and H01 to one side of the nominal path (dashed line). These two beams get multiplied to the other side of the nominal after entering the second cavity formed by beam splitter D06, mirror B01, mirror B02, and mirror D07. Therefore, there will be four beams (H02, H03, H04, H05) leaving the system through beam splitter D06. Note that the dotted lines in the figure are the nominal beam paths which only exist when the right-angled prism has not shifted, and they are just for reference here. No beam actually goes through this nominal route in this scenario.

In order to generate a flat-top beam ensemble, three parameters need to be arranged in an appropriate relation. By proper adjusting the shifting distance of prism D02, one can tune the space (a) between D03 and H01, and hence the space between H02 and H03, and the space between H04 and H05 as well. By adjusting the displacement of prism D04, one can tune the space between H03 and H04 (b). Lastly, one can choose the beam splitter D01 reflectivity such that beams D03 and H01 possess different powers with a desired ratio.

Figure 15B:
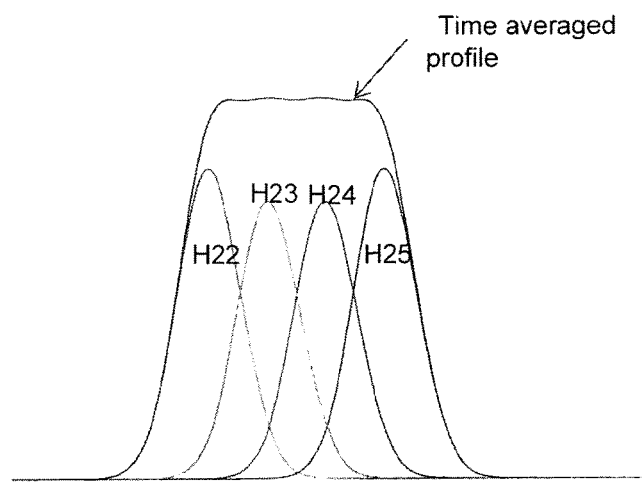
FIG. 15B illustrates an exemplary flat-top profile generated by the design shown in FIG. 15A.

FIG. 15B illustrates an exemplary output beam profile generated from this setup of FIG. 15A. In this exemplary embodiment, for an input Gaussian beam radius w ($1/e^2$ definition), a flat-top output profile is generated by a~0.9 w, b~0.86 w, the reflectivity of beam splitter D01 $R_{D01}$~0.65, and the reflectivity of beam splitter D06 $R_{D06}$~0.33. This example generates a time-averaged output profile with a substantially flat top of width about 2.3 w. Other combinations may also work depending on how flat a profile is required.

In the above cited '075 and '593 applications which are incorporated by reference herein, alternative embodiments of laser pulse repetition rate multipliers are described. These applications explain how the repetition rate of a pulsed laser may be doubled using a ring cavity of appropriate length by using a beam splitter to direct approximately ⅔ of the energy of each input pulse into the cavity while directing approximately ⅓ of the energy of each pulse to the output. With a cavity optical path length corresponding to approximately half the time interval between the input laser pulses, the output pulse trains form envelopes of substantially similar energy which repeat at a repetition rate that is twice that of the original laser pulses. The '593 application also describes how to adjust the transmission and reflectivity of the beam splitter so as to maintain substantially equal output pulse energies to compensate for losses in the beam splitter and ring cavity. Any of the principles described in the '075 and '593 applications may be applied as appropriate to the various embodiments of pulse repetition rate multipliers described herein.

A detailed description of one or more embodiments of the invention is provided above along with accompanying figures that illustrate the principles of the invention. The invention is described in connection with such embodiments, but the invention is not limited to any embodiment.

For example, in one embodiment, the optical components can be coated with appropriate coatings for the laser wavelength. Each surface of any transmissive elements, such as wave-plates, can also have an anti-reflection coating that minimizes the amount of laser energy reflected at each surface. Mirrors can be coated with coatings designed to maximize the reflection and minimize scattering at the laser wavelength.

In another example, in one embodiment, the Herriott-cell-like cavity may have a different shape or a different number of mirrors from the examples given above.

Although the above illustrated embodiments are drawn in one plane, alternative embodiments can place one of the cavity loops, such as the secondary cavity loop in FIG. 8 or FIG. 15A, in a plane approximately perpendicular, or rotated relative, to the plane of another cavity loop, such as the primary cavity loop, while still using the same set of mirrors. For example, FIGS. 16A and 16B are front and side views showing a 2× pulse repetition rate multiplier arrangement in which input pulses and output pulses are directed in a plane perpendicular to the plane of the cavity loop formed by beam splitter D01, beam compensator or prism D02, and curved mirrors B01 and B02. FIGS. 16C and 16D are front and top views showing a 4× arrangement in which one or more mirrors or prisms can be used outside of the cavity to direct or deflect the light from prism D04 to mirror D05 lying in the plane of the secondary loop. Note in FIG. 16D, the input and output beams, the plane of the 2× cavity loop, beam splitter D01 and beam compensator or prism D02 are shown as seen from above by dashed lines for reference. The optical components of one cavity loop are positioned so that they do not intercept the other cavity loop. An advantage of placing different cavity loops in different planes is that it is possible for each of the cavity loops to be reflected from the curved mirrors, such as mirrors B01 and B02, at substantially similar distances from the centers of those mirrors (as shown in FIG. 16C, where the dashed lines show the input and output light paths and the plane of the 2× loop as viewed from the front), allowing the cavity loops to be in focus at the same time and so minimize aberrations of the laser beam as it traverses the cavity loops multiple times. By orienting and displacing prisms D02 and D04 in appropriate directions in a manner similar to that illustrated in FIG. 15A, the 4× laser pulse repetition rate multiplier shown in FIGS. 16C and 16D can generate an output with a time-averaged substantially flat-top profile similar to that shown in FIG. 15A.

Figure 17:
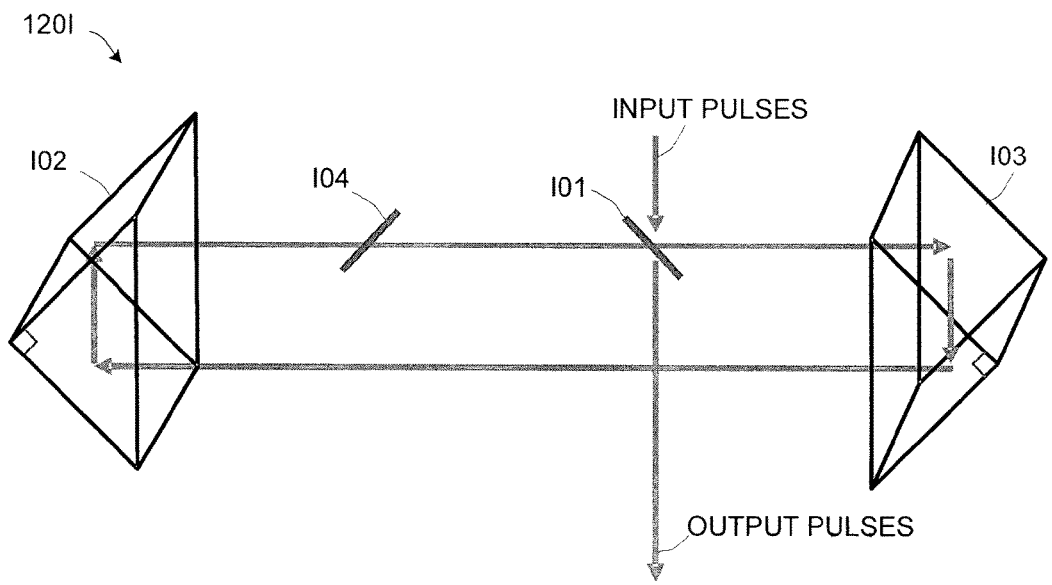
FIG. 17 illustrates an exemplary repetition rate multiplier with 2 right angle prisms and a beam splitter.

FIG. 17 illustrates an exemplary laser pulse repetition rate multiplier 120I configured to generate a pulse train with a repetition rate that is twice that of the rate of the input laser pulses, which are generated by a laser (not shown) in the manner described above. Similar to the concept described in the above cited '593 U.S. patent application, a beamsplitter (I01) is placed in a ring cavity with an optical path length that is approximately equivalent to half the time interval between two consecutive input laser pulses. The ring cavity comprises two right-angle reflective-pair optical elements such as prisms (I02 and I03) which reflect the laser pulses by total internal reflection (TIR). Right-angle reflective-pair optical elements I02 and I03, have several advantages over mirrors when used in the ring cavity of laser repetition rate multiplier 120I. One disadvantage of mirrors is that the mirrors need high reflectivity coatings in order to minimize losses as the laser pulses circulate in the ring cavity. High reflectivity coatings can be damaged by the peak power of the laser pulses, particularly for deep UV lasers with powers of hundreds of mW or higher. The use of TIR instead of high reflectivity coatings eliminates the risk of those coatings being damaged under long-term operation with high laser power. A second advantage of the use of prisms rather than mirrors is that the four mirrors needed to form two mirror-based right-angle reflective-pair elements are replaced by two prisms, reducing the number of optical components. A third advantage of the use of prisms is that the right angle between two TIR surfaces of one prism is fixed and can be manufactured with high precision. The tight angular tolerances of the prisms and the reduced number of optical components simplify the alignment of the ring cavity of FIG. 17.

As explained in the '593 application, in a laser pulse repetition rate doubler, if it is desired that the each output pulse be of substantially equivalent total energy, then the beam splitter I01 should be designed to reflect a substantially $2/3$ (second) fraction of the energy of each input laser pulse into the ring cavity, and to transmit a substantially $1/3$ (first) fraction of each input laser pulse such that the $1/3$ fraction exits repetition rate multiplier 120I at a first time, and such that the $2/3$ fraction exits repetition rate multiplier 120I at a second time after being reflected between reflective elements I02 and I03. This can be achieved, for example, by the use of an appropriate coating on beam splitter I01. Note that if substantially equal output pulse energies are not required, then beam splitter I01 may be designed to reflect some fraction of each laser pulse other than $2/3$. For example, when used in an inspection system, it may be desirable that each output pulse have substantially equal peak power to allow operation close to the damage threshold of the article being inspected. Substantially equal peak powers of the output pulses can be achieved using a beam splitter than reflects about 62% of each laser pulse into the ring cavity.

As explained in the '593 application, the optical path length of the ring cavity may be set to be slightly longer than, or slightly shorter than, the distance equivalent to half the time interval between input laser pulses so as to broaden the output pulses and reduce the peak power of each output pulse and so reduce the possibility of damage to downstream optics or to an article being inspected or measured by a system incorporating a laser repetition rate multiplier.

For example if the input laser pulses have a repetition rate of 120 MHz, then an ring cavity optical path length of about 1.249 m would result in the repetition rate being doubled with the output pulses being approximately equally spaced in time. To achieve this ring cavity optical path length, the physical distance between the prisms would need to be about 0.625 m. As understood by one skilled in the appropriate arts, since the laser pulses travel a short distance inside each prism I01 and I02 and the refractive index of the prism material is greater than 1, the optical path length within the prism is a little longer than the physical distance traveled by the laser pulses inside the prism. An appropriate small adjustment can be made to the physical distance between the prisms in order to compensate for this in order to achieve the desired ring cavity optical path length. If it is desired that the output pulses be broader than the input pulses in order to reduce the peak power of each pulse, then the ring cavity optical path length can be set to be a little longer or a little shorter than 1.249 m, such as a ring cavity optical path length of 1.25 m so that a pulse that has traveled twice around the ring cavity arrives about 6 ps (picoseconds) later than the next input pulse.

In a preferred embodiment, the ring cavity of repetition rate multiplier 120I preferably includes an optical plate I04 to substantially compensate for the offset in the laser beam position caused by the laser pulses passing through beam splitter I01. Optical plate I04 should preferably have an optical thickness substantially equal to the optical thickness of beam splitter I01. Optical plate I04 should preferably be coated with an anti-reflection coating so as to minimize the reflection of laser light from its surfaces. If optical plate I04 is placed in the same arm of the ring cavity (as shown), then preferably optical plate I04 should be oriented at angle to the input laser beam (pulses) that is substantially a mirror image of the angle to laser beam of the beam splitter I01 so as to substantially compensate for the beam displacement caused by the beam splitter I01. If the optical plate I04 is placed in the other arm of the ring cavity (not shown), then it should preferably be oriented substantially parallel to the beam splitter I01.

Figure 18:
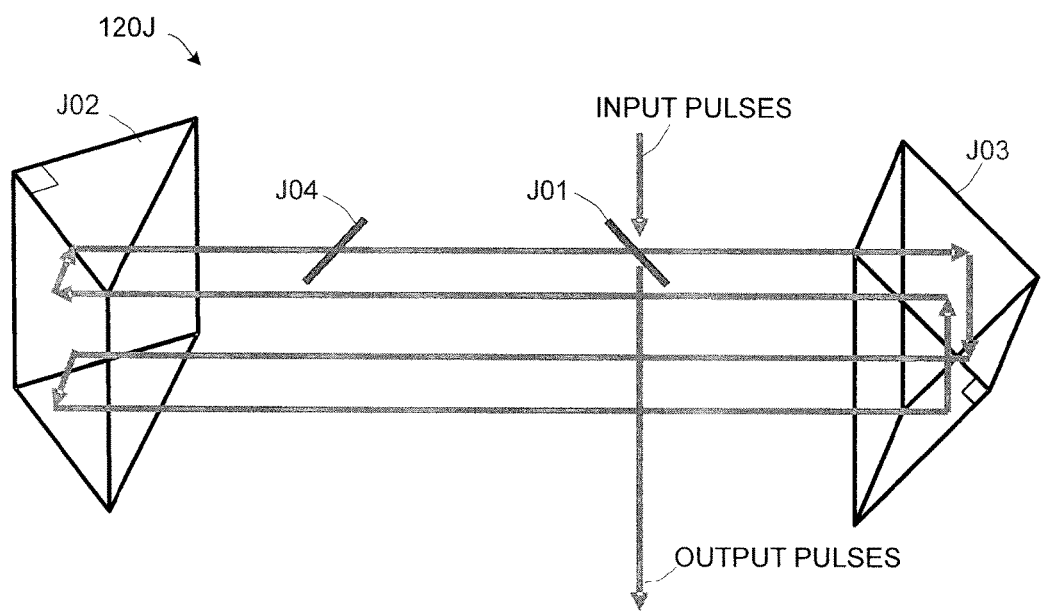
FIG. 18 illustrates another exemplary repetition rate multiplier similar to Figure A except that one of the prisms is rotated 90° to double the delay time of laser pulses for a given distance between the prisms.

FIG. 18 illustrates another laser pulse repetition rate multiplier 120J similar to that of FIG. 17 but with one of its right angle prisms (J02) rotated 90° relative to the other right angle prism (J03). Compared with the configuration of FIG. 17, laser pulse repetition rate multiplier 120J of FIG. 18 can achieve the same ring cavity optical path length with substantially half the physical separation between the two prisms, thus resulting in a more compact laser pulse repetition rate multiplier. Beam splitter J01 and optical plate J04 perform the same functions as beam splitter I01 and optical plate I04 of FIG. 17. Note that optical plate J04 can be placed in any one of the four arms of the ring cavity with an appropriate choice of orientation of the plate.

Figures 19A, 19B, 19C:
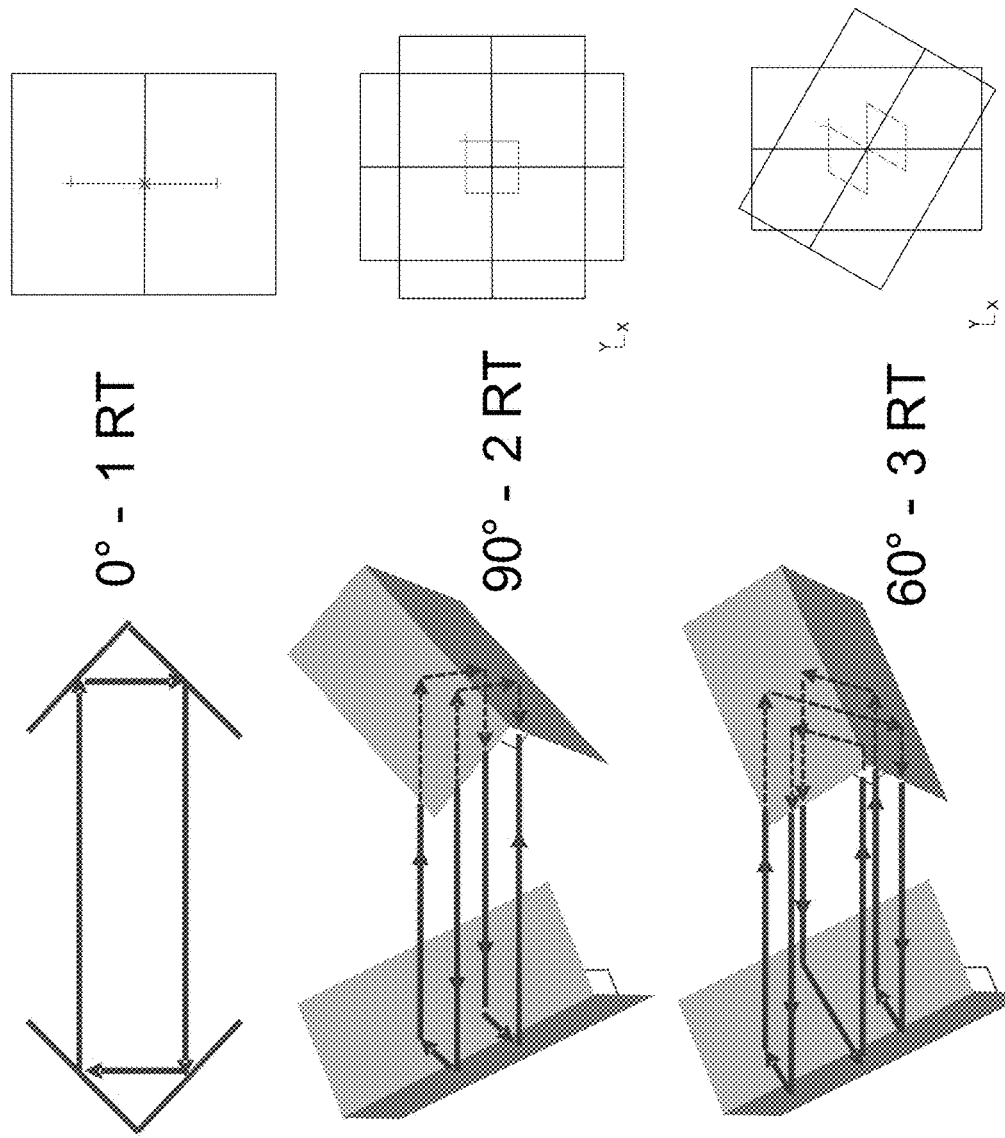
FIGS. 19A, 19B and 19C are simplified diagrams illustrating how, in accordance with one embodiment, the ring cavity length can be changed to different integer multiples of the physical cavity length by rotating one of the right angle mirror pairs or prisms.

FIGS. 19A, 19B and 19C illustrate exemplary embodiments in which the ring cavity optical path length is made substantially equal to double (FIG. 19A), quadruple (FIG. 19B), six times (FIG. 19C) or other even integer multiple of the physical separation of the prisms by rotating one of the right-angle prisms (or equivalently right-angle mirror pairs) as shown to an appropriate angle with respect to the other prism/mirror pair. The number of loops around the ring cavity which each pulse must take before returning to its original launch position (for example the beam splitter, which is not shown in FIGS. 19A-19C) is m=180°/θ, where θ is the relative angle in degrees between the two prisms (or mirror pairs). Referring to FIG. 19A, when θ=0, or equivalently 180°, m=1 and the beam stays in the one plane and makes only one loop around the ring cavity before returning to its original position. Referring to FIG. 19B, when θ=90°, m=2 and each laser pulse makes two loops around the ring cavity in order to return to its original position. Referring to FIG. 19C, when θ=60°, m=3 and the beam goes back to original launching position after three loops around the ring cavity. The polarization is always preserved when the beam returns to its original position.

A key benefit of this design is maintaining substantially the same cavity footprint while changing the ring cavity optical path length by simply rotating one of the prisms.

Figure 20:
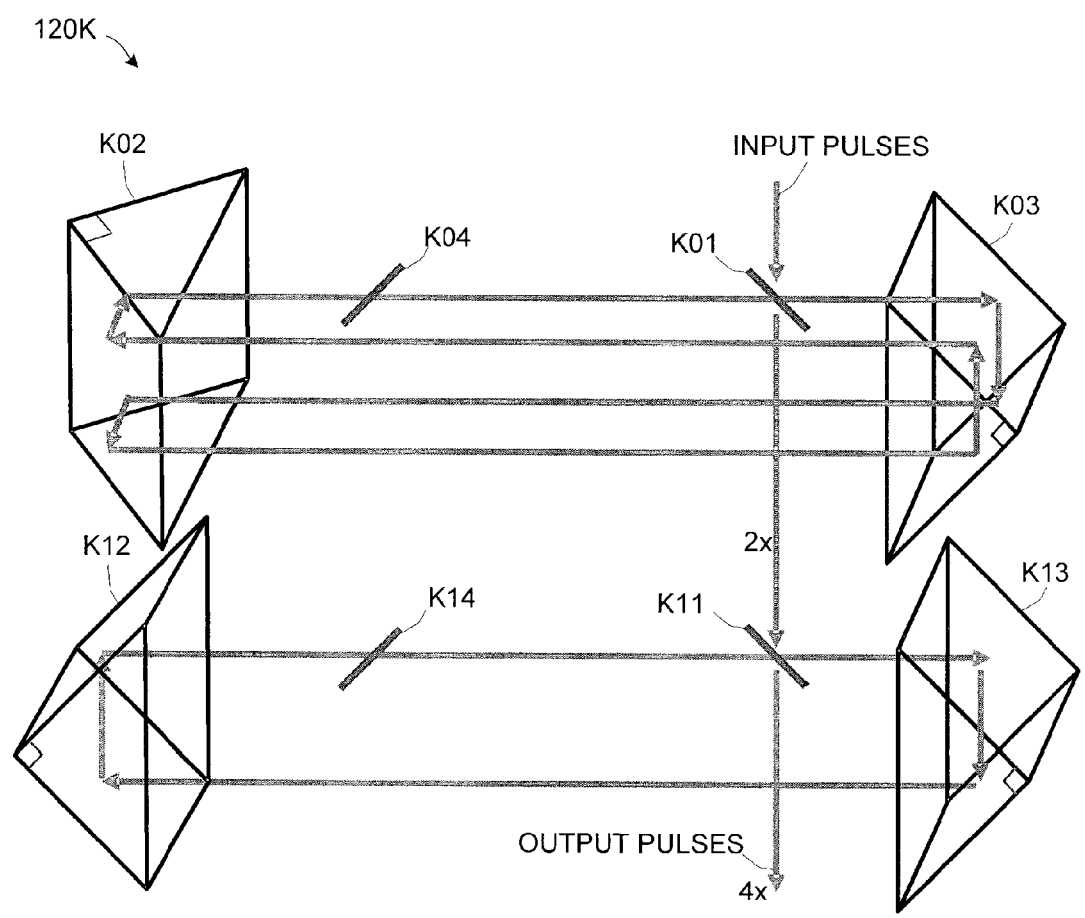
FIG. 20 illustrates one possible embodiment to generate a pulse train with a repetition rate that is 4 times the rate of the input pulse train using two cavities of similar external dimensions.

FIG. 20 illustrates another repetition rate multiplier 120K according to an exemplary embodiment in which two ring cavities of different optical path lengths are cascaded to quadruple the repetition rate of a pulsed laser. The two ring cavities have substantially similar external dimensions in spite of one ring cavity having twice the optical path length of the other. The first ring cavity comprises beam splitter K01, prisms K03 and K02, and optical plate K04. The first cavity doubles the repetition rate by using two loops around the ring cavity to achieve the desired optical path length. The second ring cavity comprises beam splitter K11, prisms K12 and K13 and optical plate K14. The second ring cavity doubles the repetition rate a second time using a single loop around the ring cavity. Since the spatial distance between successive pulses is halved after the repetition rate is doubled, the second ring cavity should preferably have substantially half the optical path length of the first ring cavity.

The two ring cavities can be fabricated from the same optical components. Since the two cavities can have substantially similar external dimensions, much of the mounting hardware and mechanical design can be the same. Space can be used more efficiently than in a design where one ring cavity has about twice the physical length of the other ring cavity.

Figure 21:
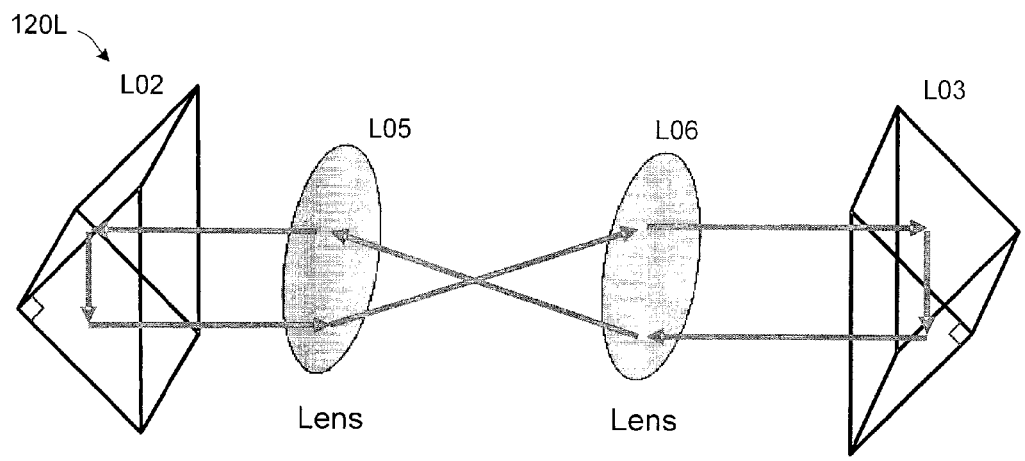
FIG. 21 illustrates one exemplary lens configuration used in a pulse repetition rate multiplier to maintain the laser beam quality of each pulse as it travels around the ring cavity.

FIG. 21 illustrates a ring cavity portion of a repetition rate multiplier 120L according to an exemplary lens configuration inserted in the ring cavity formed by prisms L02 and L03 such that the laser beam is substantially refocused (imaged) back to its original beam condition (waist location and size) when it returns to its original position after one loop around the ring cavity. Lenses L05 and L06 should preferably have equal focal lengths, that focal length chosen so as to form a beam waist at the center of the cavity, and the lenses are preferably located as far away from the waist as practical to avoid the high laser power density near the beam waist. Other components of the laser pulse repetition rate multiplier (such as the beam splitter and optical plate) are omitted from this figure for clarity.

Figure 22:
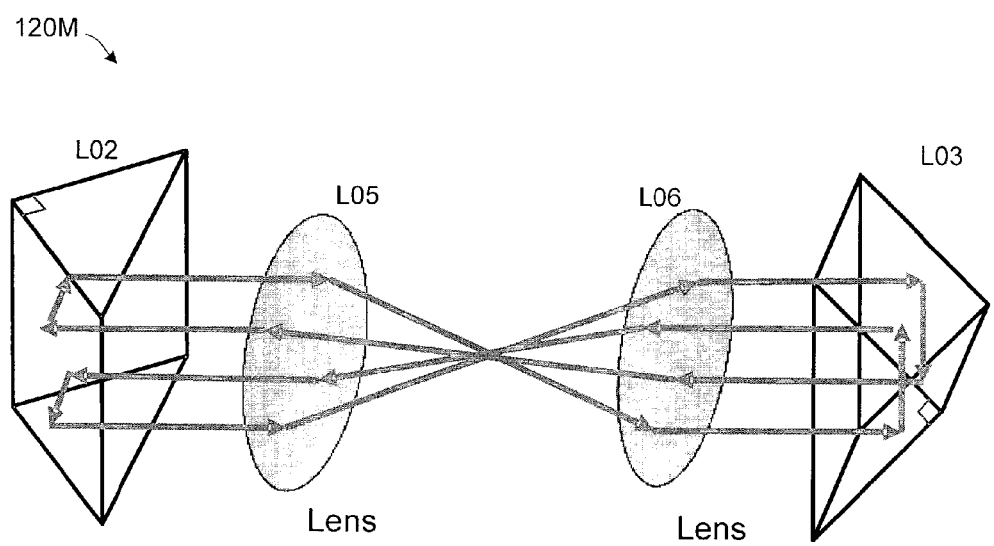
FIG. 22 illustrates a lens configuration similar to FIG. 21 which retains the laser beam quality in a ring cavity that has one of the prisms rotated relative to the other.

FIG. 22 illustrates another ring cavity portion of a repetition rate multiplier 120M in which the same lens configuration (i.e., prisms L02 and L03 and lenses L05 and L06, see FIG. 21) inserted in a 2-loop cavity will image the laser beam back to its original beam condition (waist location and size) when it returns to its original position. Similarly this lens configuration will correctly reimage the laser beam for any number of loops around the ring cavity.

Figure 23:
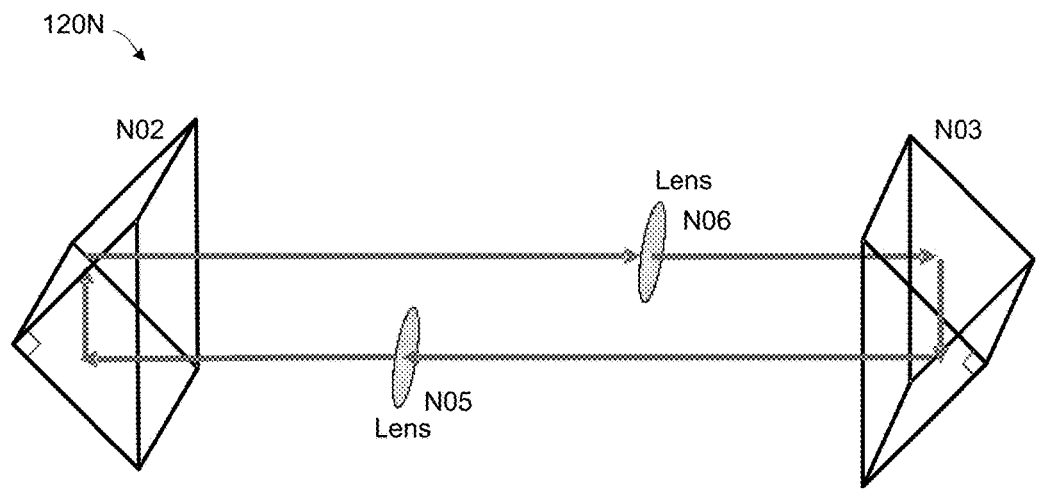
FIG. 23 illustrates an alternative exemplary lens configuration used in a pulse repetition multiplier to retain the laser beam quality of each pulse as it travels around the ring cavity.

FIG. 23 illustrates another ring cavity portion of a repetition rate multiplier 120N utilizing another exemplary lens configuration using two prisms N02 and N03 and two lenses N05 and N06 arranged such that the laser beam is imaged back to its original beam condition (waist location and size) when it returns to its original position. In this embodiment, lenses N05 and N06 should preferably have focal lengths approximately equal to the cavity length and be located close to the prisms such that the beam waist is formed near the center of cavity and not too close to any of the prism or lens surfaces.

Figure 24:
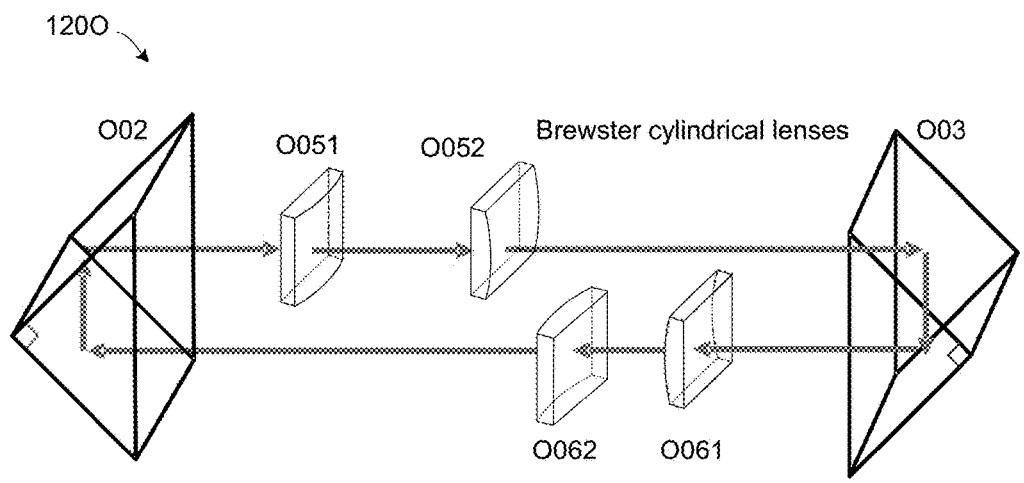
FIG. 24 illustrates another exemplary lens configuration used in a pulse repetition rate multiplier to retain the laser beam quality using cylindrical lenses with the laser incident on each lens at an angle approximately equal to Brewster's angle.

FIG. 24 illustrates another ring cavity portion of a repetition rate multiplier 120O utilizing another exemplary lens configuration similar to FIG. 23, except that each spherical lens is replaced with a pair of cylindrical lenses (i.e., spherical lens N05 is replaced by cylindrical lenses O051 and O052, and spherical lens N06 is replaced by cylindrical lenses O061 and O062. Each cylindrical lens is preferably oriented close to Brewster's angle relative to the direction of propagation and the polarization of the laser beam. The advantage of orienting the lenses at or near Brewster's angle for p-polarization is that the reflectivity of each lens surface will be very low without using any coating, thus saving the cost of the coating and avoiding any coating damage by the laser. The curvature of one cylindrical lens in each pair is oriented orthogonally to the curvature of the other cylindrical lens in the same pair (i.e. the curvatures are sagittal and tangential) such that together they re-image the beam in a substantially similar manner as one of the spherical lenses shown in FIG. 23.

Figure 25A:
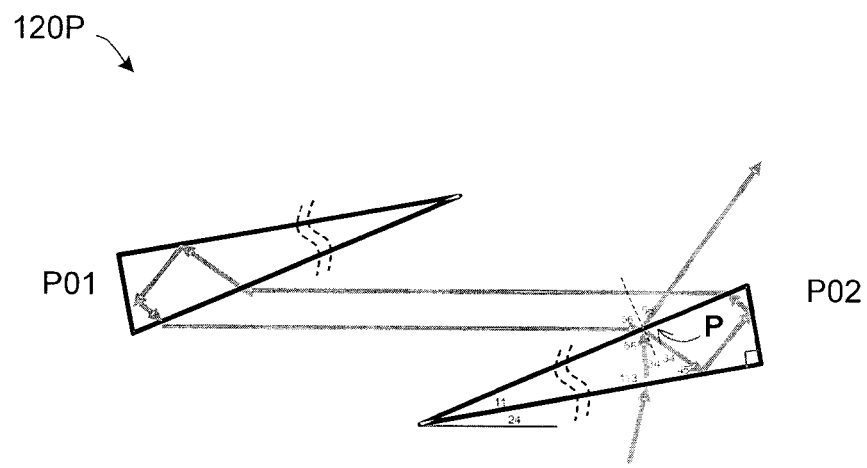
FIGS. 25A and 25B illustrates two exemplary pulse repetition rate multipliers with special prism designs that combine the beam splitter function into one of prisms. Both repetition rate multipliers can use Brewster angle prisms for recirculating the light in the cavity. The repetition rate multiplier of FIG. 25B can use all uncoated optics avoiding the possibility of coating damage by high intensity deep UV laser pulses.

FIG. 25A illustrates another exemplary embodiment of a laser pulse repetition rate multiplier 120P with modified right-angle prism pairs (P01 and P02). Prism P01 serves the same function as prism I02 in FIG. 17, except that prism P01 is cut and positioned so that the incidence angle is close to Brewster's angle for p-polarization of the laser beam. Hence no AR coating at the prism is required and potential coating damage under high laser power is avoided. Prism P02 has the same shape as prism P01 and is also oriented close to Brewster's angle relative to p-polarization of the laser beam. Prism P02 has an additional coating only around point P (not the whole surface), which serve as the beam splitter that couples the light in and out of the cavity. This eliminates the need for a separate beam splitter component, thus reducing the number of optical components and simplifying alignment of the ring cavity. As explained above, in one preferred embodiment, the coating is designed to reflect approximately ⅔ of the energy of each incident laser pulse so as to produce substantially equal energy in each output laser pulse.

Figure 25B:
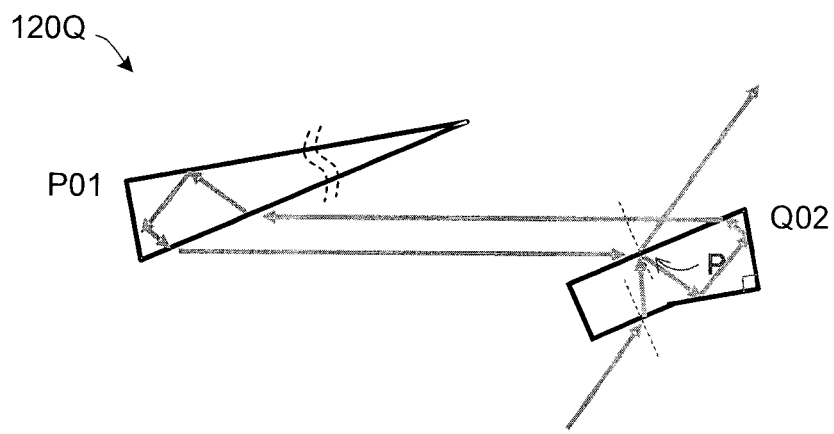

FIG. 25B illustrates another exemplary embodiment of a laser pulse repetition rate multiplier 120Q similar to that of FIG. 25A that utilizes the same prism P01, but replaces prism P02 of FIG. 25A is replaced by prism Q02 which has a modified shape. This shape enables the input and output beams to be parallel to each other, which is generally desired as it makes it simpler to integrate the laser pulse repetition rate multiplier into a system. Prism Q02 maintains a right-angle between the TIR faces of the prism and uses an incidence angle close to Brewster's angle for the laser beam in the ring cavity. As described above for prism P02, a coating is required around location P in order for the prism to perform the beam splitter function.

Figure 26A:
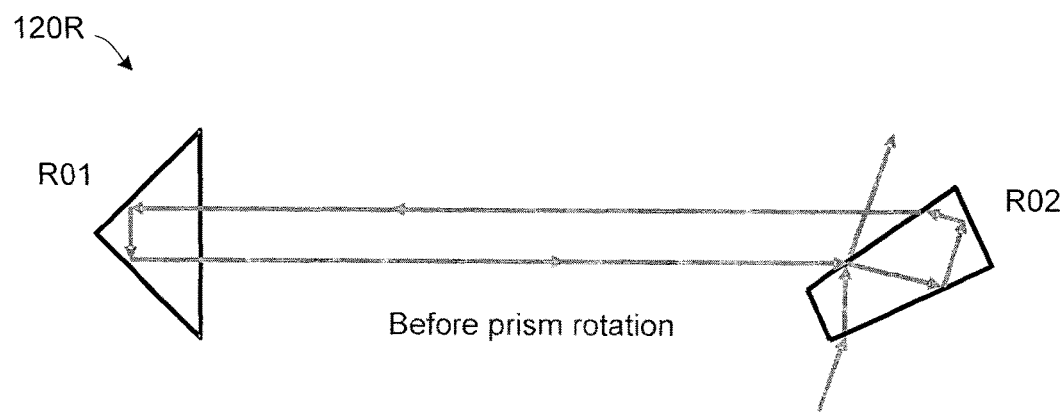
FIGS. 26A and 26B illustrate exemplary repetition rate multipliers similar to those of FIG. 25A but with one of the prisms rotated 90° to double the pulse delay time.
Figure 26B:
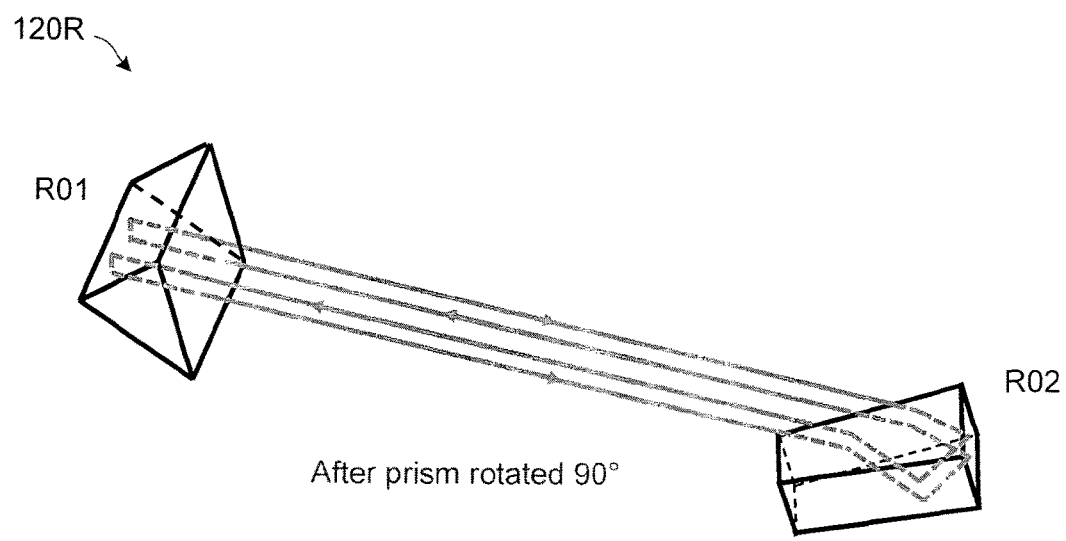

FIGS. 26A and 26B illustrate a repetition rate multiplier 120R according to an exemplary embodiment in which the effective beam path length can be doubled (or tripled, etc.) for a given physical ring cavity length by rotating one of two right-angle prisms R01 and R02, whether Brewster-angle cut or not. In these figures, prism R02 having a Brewster-angle cut surface has to be rotated with respect to the axis normal to this Brewster-angle incidence surface such that the beam polarization state and incidence angle (i.e. the Brewster condition) remain the same after rotation.

FIGS. 27A and 27B are top and side views, respectively, illustrating a repetition rate multiplier 120S according to another multiplier design with three prisms S01, S02 and S03, each having a different shape, such that no coating is needed at any surface. Prism S01 performs the dual functions of a reflector in the ring cavity and a beam splitter which couples the beam in and out of the cavity at a desired reflectivity, such as a reflectivity of about R=⅓. Note that in the side view shown in FIG. 28B, prism S02 is hidden behind prism S01. Various angles between surfaces of the various prisms are indicated in the figures.

Figures 29A, 29B:
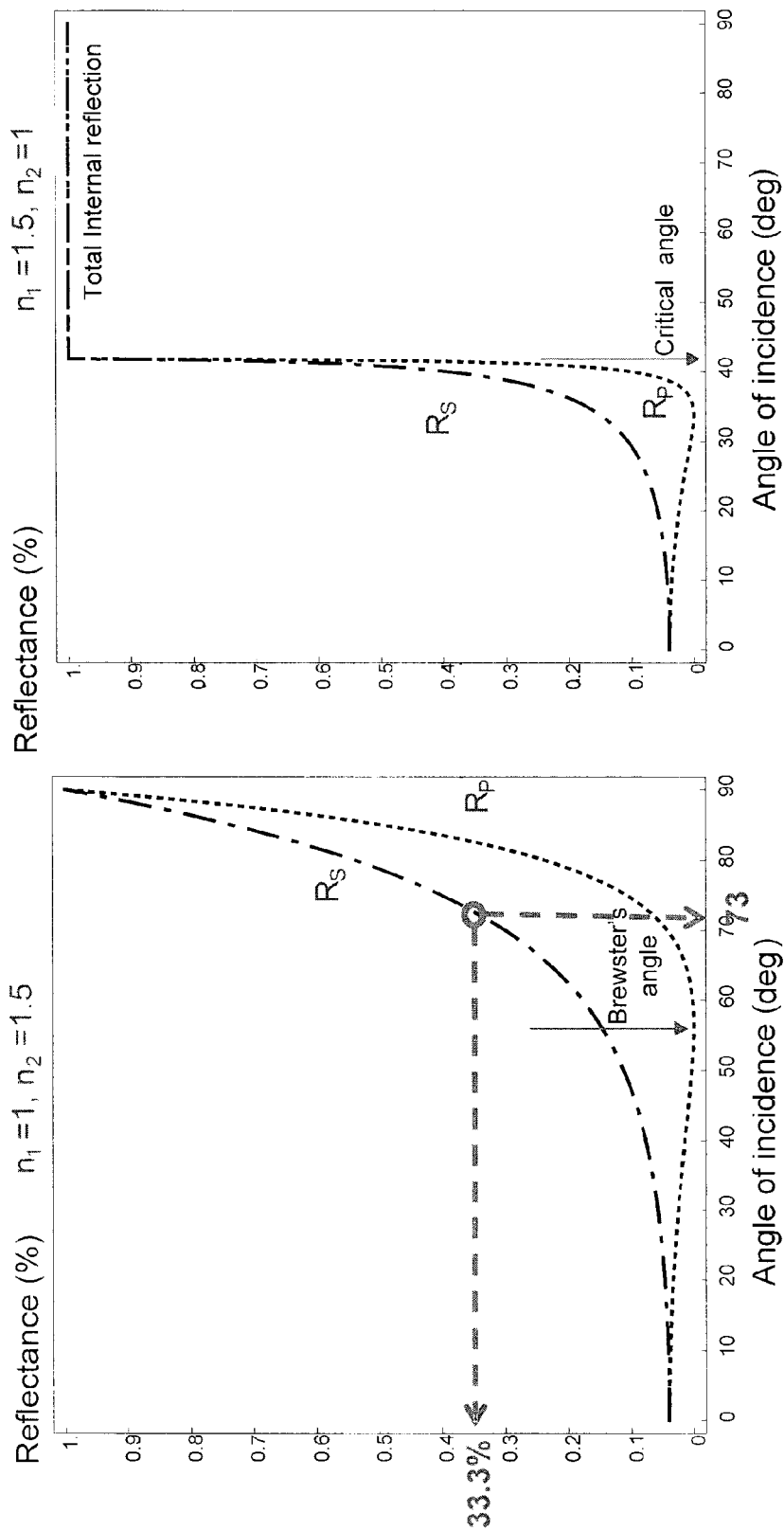
FIGS. 29A and 29B are graphs illustrating Fresnel reflection as a function of angle of incidence for both external and internal reflection. The angle of incidence used in one embodiment of the first prism of FIG. 27A is shown.

The geometry of Prism S01 is shown in FIGS. 28, 28A, 28B and 28C. It utilizes Fresnel reflectivity properties as shown in FIGS. 29A and 29B. For S-polarized light hitting a surface of fused silica (or any material with similar refractive index), the reflectivity naturally goes to about 33.3% when angle of incidence is approximately 73°. The input laser beam b1 and the output laser beam b2 are S-polarized with respect to the surface S1. However, when the refracted beam passes through surface S2 or S3, it is P-polarized. If the angle of incidence on these surfaces (S2 and S3) is close to Brewster's angle, the laser beam can pass with minimal loss of power without using any coating and hence avoiding any possibility of laser damage to the coating.

Prism S02 of repetition rate multiplier 120S (see FIG. 27A) is illustrated in FIGS. 30, 30A and 30B. This prism utilizes reflection at Brewster's angle at surfaces S4 and S5 while using total internal reflection at surface S6.

Prism S03 of repetition rate multiplier 120S (see FIG. 27A) is illustrated in FIGS. 31, 31A 31B and 31C. It serves as a right-angle prism with two surfaces cut at Brewster's angle. These Brewster's angle cuts are oriented for beam polarization perpendicular to the ring cavity plane, which is different from the prism design P01 in FIG. 25A, which is for polarization parallel to the ring cavity plane.

FIG. 32A illustrates a repetition rate multiplier 120T according to another exemplary laser pulse repetition rate multiplier configuration with polarization parallel to the ring cavity plane. This configuration forms a rectangular layout and 90° beam coupling (in/out) which can be more convenient for incorporation into an instrument. This configuration comprises three elements. Beam splitter T01 has a coating having a chosen reflectivity, such as a reflectivity of R=⅓, at an angle of incidence of 45° on one surface and having an antireflective (AR) coating on the other surface. As indicated in FIG. 32B, in one preferred embodiment prism T02 is a Pellin Broca prism, which functions as a mirror deflecting the beam in a total of 90° with the input and output surfaces at Brewster's angle relative to the beam in ring cavity. Prism T02 uses total internal reflection inside the prism. In this way there is almost no energy loss for a p-polarized beam without using any coating. In an alternative embodiment, a mirror with a high reflectivity coating is used in place of prism T02. Element T03 is symbolically drawn as a right-angle prism. In a preferred embodiment, prism T03 uses a geometry with Brewster-cut surfaces such as the design P01 shown in FIG. 25A for polarized light with the polarization parallel to the plane of the ring cavity.

In a similar manner to that explained above, right-angle prism T03 can be rotated by 90° about a normal direction to the incident surface, to double the beam path length within the cavity.

Figure 33:
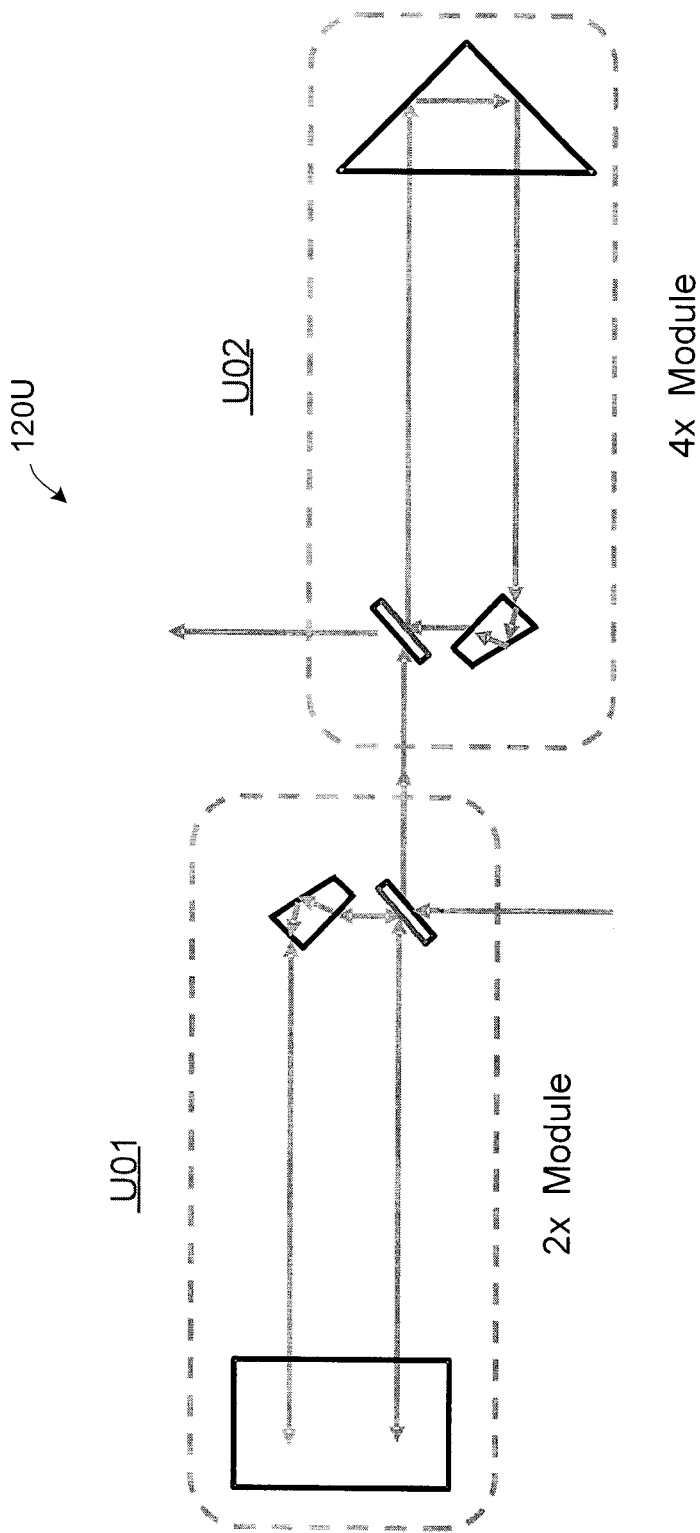
FIG. 33 illustrates an exemplary 4× repetition rate multiplier comprising two ring cavities similar to that shown in FIG. 32A where one of the ring cavities has its prism rotated through 90° so as to double its effective cavity length.

FIG. 33 illustrates a repetition rate multiplier 120U according to an exemplary embodiment in which two ring cavities similar to those of the embodiment of FIG. 32A are cascaded to multiply the repetition rate by 4. The first ring cavity U01 has one prism rotated by 90° so that the optical path length of this cavity is approximately twice that of the second cavity U02 even though both cavities have similar physical dimensions. These two ring cavities together form a multiplier that quadruples the repetition rate.

In the above cited '075 and '593 applications which are incorporated by reference herein, alternative embodiments of laser pulse repetition rate multipliers are described. These applications explain how the repetition rate of a pulsed laser may be doubled using a ring cavity of appropriate length by using a beam splitter to direct approximately ⅔ of the energy of each input pulse into the cavity while directing approximately ⅓ of the energy of each pulse to the output. With a cavity optical path length corresponding to approximately half the time interval between the input laser pulses, the output pulse trains form envelopes of substantially similar energy which repeat at a repetition rate that is twice that of the original laser pulses. The '593 application also describes how to adjust the transmission and reflectivity of the beam splitter so as to maintain substantially equal output pulse energies to compensate for losses in the beam splitter and ring cavity. Any of the principles described in the '075 and '593 applications may be applied as appropriate to the various embodiments of pulse repetition rate multipliers described herein.

To reach an even higher repetition rate, one can cascade multiple units of any of the abovementioned laser pulse repetition rate multipliers with each unit having a different cavity length. The output repetition rate can be made equal to 2×, 4×, . . . or $2^n$× that of the input repetition rate where n is the number of laser pulse repetition rate multiplier cavities, and the optical path length of each cavity is ½, ¼, ... ½$^n$ of the distance between the original pulses.

The above exemplary embodiments illustrate how optical cavities of different lengths may be formed from various combinations of flat mirrors, curved mirrors, prims and lenses for the purpose of multiplying the repetition rate of a pulsed laser. A repetition rate multiplier or a repetition rate multiplier that generates an output with a time-averaged substantially flat-top profile may be constructed from other combinations without departing from the scope of this invention. For example, a flat mirror may be replaced by a prism (or, in many cases, vice versa), or a curved mirror by a combination of a flat mirror and one, or more, lenses (or vice versa). The choice of which components to use is dictated by many practical considerations, including the laser wavelength, the laser power density at the location of the optical components, the availability of a suitable optical coating for the component, physical space and weight. As explained above, prisms and components with Brewster angle surfaces are generally preferred where power densities are high enough to potentially damage optical coatings.

The scope of the invention is limited only by the claims and the invention encompasses numerous alternatives, modifications and equivalents. Numerous specific details are set forth in the above description in order to provide a thorough understanding of the invention. These details are provided for the purpose of example and the invention may be practiced according to the claims without some or all of these specific details. For the purpose of clarity, technical material and derivation that are known in the technical fields related to the invention has not been described in detail so that the invention is not unnecessarily obscured.

The invention claimed is:

1. A flat-top beam generator comprising:
a laser pulse repetition rate multiplier including an optical cavity comprising a beam splitter, two spherical mirrors and a beam shifter, said laser pulse repetition rate multiplier positioned to receive input laser pulses from a laser such that said input laser pulses are directed into said optical cavity and exit said optical cavity as output laser pulses having an output pulse repetition rate that is at least two times that of the input laser pulses,
wherein said optical cavity is configured such that each said laser pulse input from said laser is directed along a plurality of optical paths defined by said two spherical mirrors, wherein each of the plurality of optical paths passes through said beam shifter and said beam splitter,
wherein the beam shifter is configured to laterally displace said each laser pulse directed along a first optical path of said plurality of optical paths to a second optical path of said plurality of optical paths, and
wherein said beam splitter is configured to reflect portions of said laser pulses passing along said first and second optical paths such that said reflected portions respectively form first and second output laser pulses, said first output laser pulses being laterally displaced with respect to said second output laser pulses such that a time averaged output intensity of said first and second output laser pulses has a substantially flat profile in the direction of the lateral displacement.

2. The flat-top beam generator of claim 1, wherein the beam shifter comprises one of an isosceles triangle prism, and a Dove prism.

3. The flat-top beam generator of claim 1, wherein the beam shifter is configured such that the lateral displacement is approximately equal to 0.5 (half) of a beam waist radius of the input laser pulses.

4. The flat-top beam generator of claim 3, wherein the beam shifter is configured such that the optical cavity includes two separate round-trip optical paths, and such that the beam shifter diverts part of the energy of each laser pulse from a first path to a second path.

5. The flat-top beam generator of claim 4, wherein the beam shifter is configured such that the beam shifter further diverts part of the energy of each laser pulse from the second path to the first path.

6. The flat-top beam generator of claim 1, wherein the laser pulse repetition rate multiplier is configured such that the output laser pulse repetition rate is at least four times the input laser pulse repetition rate.

7. The flat-top beam generator of claim 6, wherein the beam shifter is configured such that the output laser pulses have a substantially flat output profile with said time averaged output intensity having a variation of 20% or less and having a width of between approximately 2 and 2.5 times a beam waist radius of the input laser pulses.

8. An inspection system comprising:
a DUV or VUV laser generating a series of laser pulses;
a laser pulse repetition rate multiplier that multiplies a repetition rate of the laser pulses;
optics including an objective lens for directing an output of the laser pulse repetition rate multiplier to a sample; and
optics for collecting light reflected or scattered from the sample and directing the light to a detector;
wherein the laser pulse repetition rate multiplier includes two spherical mirrors forming one or more ring cavities, a beam splitter that directs a first fraction of the energy of each input laser pulse into the one or more ring cavities, and a beam shifter,
wherein said one or more ring cavities are configured such that each said laser pulse input from said DUV or VUV laser is directed along a plurality of optical paths defined by said two spherical mirrors, wherein each of the plurality of optical paths passes through said beam shifter and said beam splitter,
whereby the beam shifter is configured to laterally displace said each laser pulse directed along a first optical path of said plurality of optical paths to a second optical path of said plurality of optical paths, and
wherein the laser pulse repetition rate multiplier is configured to reflect portions of said laser pulses passing along said first and second optical paths such that said reflected portions respectively form first and second output pulses that are laterally displaced and partially overlapped with one another so as to form a time averaged output intensity profile that has a substantially flat top.

9. The inspection system of claim 8, wherein the system implements one of an unpatterned wafer inspection system, a patterned wafer inspection system, a photomask inspection system, and a metrology system.

* * * * *